United States Patent
Garlepp et al.

(12) 
(10) Patent No.: US 6,448,813 B2
(45) Date of Patent: Sep. 10, 2002

(54) OUTPUT DRIVER CIRCUIT WITH WELL-CONTROLLED OUTPUT IMPEDANCE

(75) Inventors: Bruno Werner Garlepp, Mountain View; Kevin S. Donnelly, San Francisco; Jared LeVan Zerbe, Palo Alto, all of CA (US)

(73) Assignee: Rambus Inc., Mountain View, CA (US)

( * ) Notice: Subject to any disclaimer, the term of this patent is extended or adjusted under 35 U.S.C. 154(b) by 0 days.

(21) Appl. No.: 09/800,552

(22) Filed: Mar. 6, 2001

Related U.S. Application Data

(63) Continuation of application No. 09/179,139, filed on Oct. 26, 1998, now Pat. No. 6,198,307.

(51) Int. Cl.[7] .............................................. H03K 17/16
(52) U.S. Cl. ............................... 326/83; 326/27; 326/30
(58) Field of Search .............................. 326/21, 26, 27, 326/30, 83, 86

(56) References Cited

U.S. PATENT DOCUMENTS

| | | | |
|---|---|---|---|
| 5,164,663 A | | 11/1992 | Alcorn |
| 5,469,081 A | | 11/1995 | Horita et al. |
| 5,523,703 A | * | 6/1996 | Yamamoto et al. ............ 326/30 |
| 5,548,226 A | * | 8/1996 | Takekuma et al. ............ 326/30 |
| 5,686,872 A | * | 11/1997 | Fried et al. .................... 326/30 |
| 5,731,711 A | | 3/1998 | Gabara |
| 5,898,326 A | * | 4/1999 | Okayasu ....................... 326/30 |

* cited by examiner

*Primary Examiner*—Don Phu Le
(74) *Attorney, Agent, or Firm*—Pennie & Edmonds LLP

(57) ABSTRACT

An output driver circuit for driving a signal onto a signal line. The output driver circuit comprises at least one driver circuit and a passive network. The passive network is configured to limit the variation in the output impedance of the output driver circuit. The output driver circuit thus provides an output impedance that closely matches the loaded impedance of the signal line at all times so as to minimize secondary reflections on the signal line.

13 Claims, 20 Drawing Sheets

OUTPUT DRIVER CIRCUIT WITH WELL-CONTROLLED OUTPUT IMPEDANCE

This application is a continuation of Ser. No. 09/179,139 filed Oct. 26, 1998, U.S. Pat. No. 6,198,307.

The present invention relates generally to the field of digital circuits, and more particularly to an output driver circuit with a well-controlled output impedance for driving signal lines in a high-speed digital system.

BACKGROUND OF THE INVENTION

A signal line is a conductor used to transmit electrical signals between the various devices in an electronic system. Output driver circuits contained on each device are used to buffer signals originating from the device so that they may be driven onto the signal line.

For example, FIG. 1 illustrates a prior art digital system 1 including a plurality of devices 2, a signal transmitting device 3 and a signal line 4. The transmitting device 3 contains an output driver circuit 5 that generates a single-ended signal for output onto the signal line 4. The devices 2 are connected to the signal line 4 at various points to receive the signal. The signal line 4 includes a conductor 12, a termination resistor $R_T$ and a termination voltage $V_{Term}$. The termination resistor $R_T$ is connected to the end of the conductor 12 opposite the end connected to the output driver circuit 5. The termination resistor $R_T$ absorbs the incident signal, thereby preventing reflections of the signal from occurring at the end of the conductor 12. The termination resistor $R_T$ is also connected to the termination voltage $V_{Term}$. The termination voltage $V_{Term}$ is used to raise the voltage of the conductor 12 to the high voltage level $V_{oh}$.

An embodiment of the prior art digital system 1, a memory system 6, is shown in FIG. 2. Memory system 6 includes a plurality of dynamic random-access memories (DRAMs) 11, a clock chip 7, a clock line 8 and a memory controller 24. The clock chip 7 contains a clock driver circuit 9 that generates a single-ended clock signal for output onto the clock line 8. The clock line 8 includes a conductor 10 that passes through the memory controller 24 such that the conductor is divided into two portions: a CTM (clock to master) portion and a CFM (clock from master) portion. The CTM portion propagates the clock signal from the clock driver circuit 9 towards the memory controller 24 (the memory controller is the master device in the system). The CFM portion propagates the clock signal from the memory controller 24 towards the DRAMs 11. The DRAMs 11 are connected to both the CTM and CFM portions of the conductor 10. The conductor 10 is divided in this manner so that the clock signal can maintain a specific phase relationship with data signals (not shown) that are transmitted between the DRAMs 11 and the memory controller 24 as the signals propagate, regardless of whether the data signals are transmitted from the DRAMs to the memory controller or vice versa.

FIG. 3 shows a simplified electrical model of the clock driver circuit 9 and the clock line 8 in the memory system 6. In this model, the clock line 8 is represented by a transmission line of loaded impedance $Z_0$. The loaded impedance $Z_0$ includes the unloaded characteristic impedance $Z_0'$ of the conductor 10 as well as the impedance of the DRAMs 11 and any other devices connected to the conductor. In order to minimize clock signal reflections at the end of the conductor 10, the resistance of the termination resistor $R_T$ is typically set to equal the loaded impedance $Z_0$ of the conductor.

FIG. 4 is a waveform diagram illustrating the clock signal produced by the clock driver circuit 9 as a function of time. The clock signal has a high voltage level $V_{oh}$ and a low voltage level $V_{ol}$, where $V_{oh}=V_{Term}$, $V_{ol}=V_{Term}-2*(V_{Term}-V_{Ref})$, and $V_{Ref}$ is a reference voltage. As a result, the clock signal has a voltage swing $V_{sw}$ of $V_{sw}=2*(V_{Term}-V_{Ref})$. The clock driver circuit 9 generates this waveform by operating as a switching current source, alternately turning on and off, sinking current every other half-cycle of the clock period. The clock signal is converted into an internal clock signal for use within the DRAMs 11 by circuitry (not shown) within the DRAMs. The circuitry generates the internal clock signal by comparing the voltage of the clock signal with the reference voltage $V_{ref}$.

Unfortunately, the single-ended clock driver circuit 9 produces clock signals with relatively poor timing accuracy, i.e., "clock jitter," especially at higher clock frequencies. There are several causes for the clock jitter. First, the voltage of the clock signal is dependent on the voltage $V_{Term}$, which typically suffers from significant "noise" (i.e., rapid voltage fluctuations). The noise in the voltage $V_{Term}$ may be caused, for example, by the switching on and off of numerous transistors in the system that are coupled to the voltage source. Second, the internal clock signal that is derived from the clock signal is dependent on the voltage $V_{Ref}$, which is also noise-prone for similar reasons.

A third cause for the clock jitter are the primary and secondary reflections of the clock signal produced on the clock line 8. Primary reflections are reflections of the clock signal produced along the conductor 10 by taps along the conductor at which the DRAMs 11 are connected and by the termination resistor $R_T$. The reflections travel back towards the clock driver circuit 9. These reflections occur because of an impedance mismatch or discontinuity in the clock line 8 caused by the taps and/or the termination resistor. The primary reflections in turn cause secondary reflections to occur at the output of the clock driver circuit 9. The secondary reflections occur because the output impedance of the clock driver circuit 9, which acts as a high output impedance current source, is significantly greater than the loaded impedance $Z_0$ of the clock line 8. The secondary reflections travel back down the conductor 10, thereby disturbing the clock signal waveform and causing jitter in the clock signal received by the DRAMs 11.

In view of the shortcomings of the prior art, it is an object of the present invention to provide a clock driver circuit that generates clock signals with minimal clock jitter despite the presence of noisy voltage supply signals.

It is another object of the present invention to provide a clock driver circuit that presents an output impedance that closely matches the loaded impedance of the clock line so as to minimize secondary reflections on the clock line.

More generally, it is an object of the present invention to provide an output driver circuit that generates a signal on a signal line with these characteristics.

SUMMARY OF THE INVENTION

In summary, the present invention is an output driver circuit for driving a signal onto a signal line. The output driver circuit provides an output impedance that closely matches the loaded impedance of the signal line at all times so as to minimize secondary reflections on the signal line. The output driver circuit may be used as a clock driver circuit to drive a clock signal onto a clock line. In this application, the output driver circuit provides a clock signal with minimal clock jitter despite the presence of noisy voltage supplies.

The output driver circuit of the present invention includes at least one driver circuit and a passive network. The passive network is coupled to the output of the driver circuit and includes an output corresponding to each driver circuit for coupling to a signal line conductor. The passive network, which may be composed of a network of resistors, is configured to limit the variation in the output impedance of the output driver circuit.

The output driver circuit of the present invention includes embodiments that generate a single-ended signal and other embodiments that generate a differential signal. For the single-ended signal embodiments, the output driver circuit includes a single driver circuit coupled to a passive network. The passive network includes a series resistor and a parallel resistor. The series resistor is connected between the output of the driver circuit and the output of the passive network. The parallel resistor is connected between the output of the passive network and a voltage supply, such as $V_{DD}$ or Gnd. The passive network may optionally include a capacitor connected between the parallel resistor and the voltage supply to provide an AC ground.

For the differential signal embodiments, the output driver circuit includes first and second driver circuits and a passive network that includes first and second outputs. In a first embodiment, the passive network includes a first series resistor connected between the output of the first driver circuit and the first output of the passive network, a first parallel resistor coupled between the first output of the passive network and a differential ground node, a second series resistor connected between the output of the second driver circuit and the second output of the passive network and a second parallel resistor coupled between the second output of the passive network and the differential ground node.

In a second differential signal embodiment of the output driver circuit, the first and second driver circuits each comprise a p-channel transistor and an n-channel transistor in an inverter-like configuration, a first series resistor connected between the drain of the p-channel transistor and the output of the inverter and a second series resistor connected between the drain of the n-channel transistor and the output of the inverter. In this embodiment, the passive network includes a first parallel resistor coupled between the output of the first driver circuit and a differential ground node and a second parallel resistor coupled between the output of the second driver circuit and the differential ground node.

In a third differential signal embodiment of the output driver circuit, the first and second driver circuits each comprise a p-channel transistor and an n-channel transistor in an inverter configuration and the passive network includes a first parallel resistor coupled between the output of the first driver circuit and a differential ground node and a second parallel resistor coupled between the output of the second driver circuit and the differential ground node. In this embodiment, the gates of the p-channel and n-channel transistors of the first and second driver circuits are driven with signals having voltages such that the transistors operate in a saturation or cutoff region of operation only. The output driver circuit may further include predrivers to generate these signals.

BRIEF DESCRIPTION OF THE DRAWINGS

Additional objects and features of the present invention will be more readily apparent from the following detailed description and appended claims when taken in conjunction with the drawings, in which:

DESCRIPTION OF THE PREFERRED EMBODIMENTS

To reduce the clock jitter experienced by prior art clock drivers, the present invention employs a clock driver that presents an output impedance that closely matches the loaded impedance of the clock line. This reduces clock jitter by minimizing the occurrence of secondary reflections on the clock line.

Figure 1:
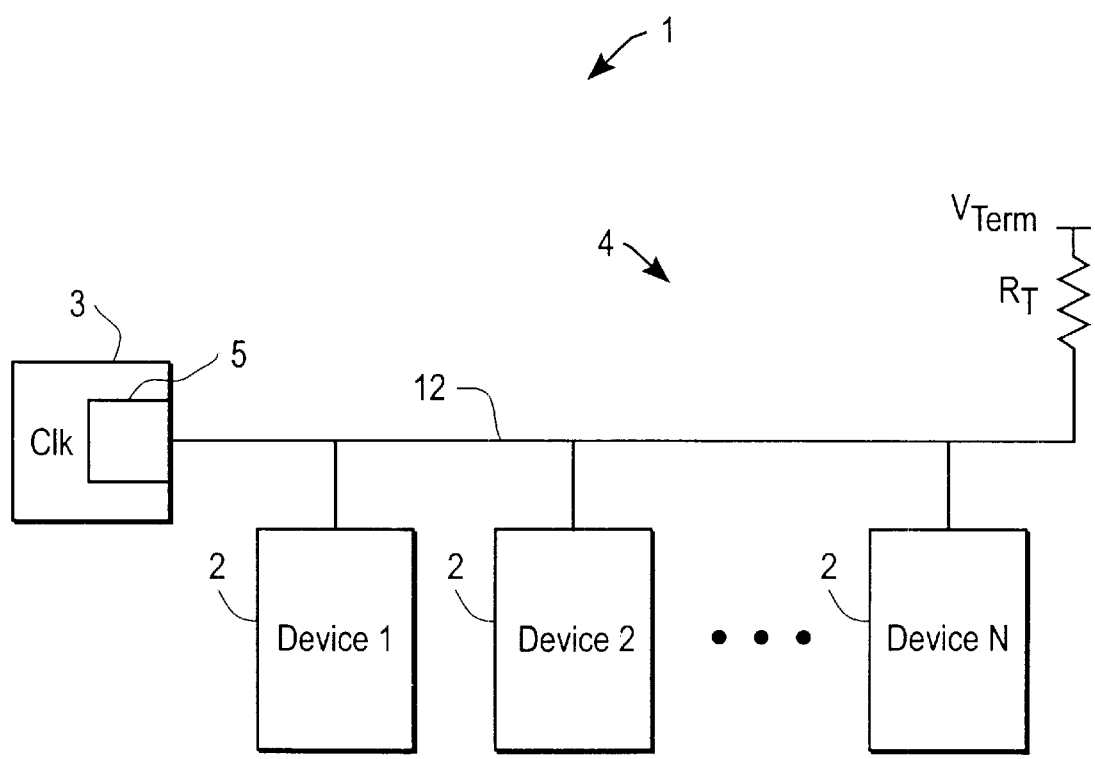
FIG. 1 is a block diagram of a prior art digital system, including a plurality of devices, a signal transmitting device and a signal line.
Figure 2:
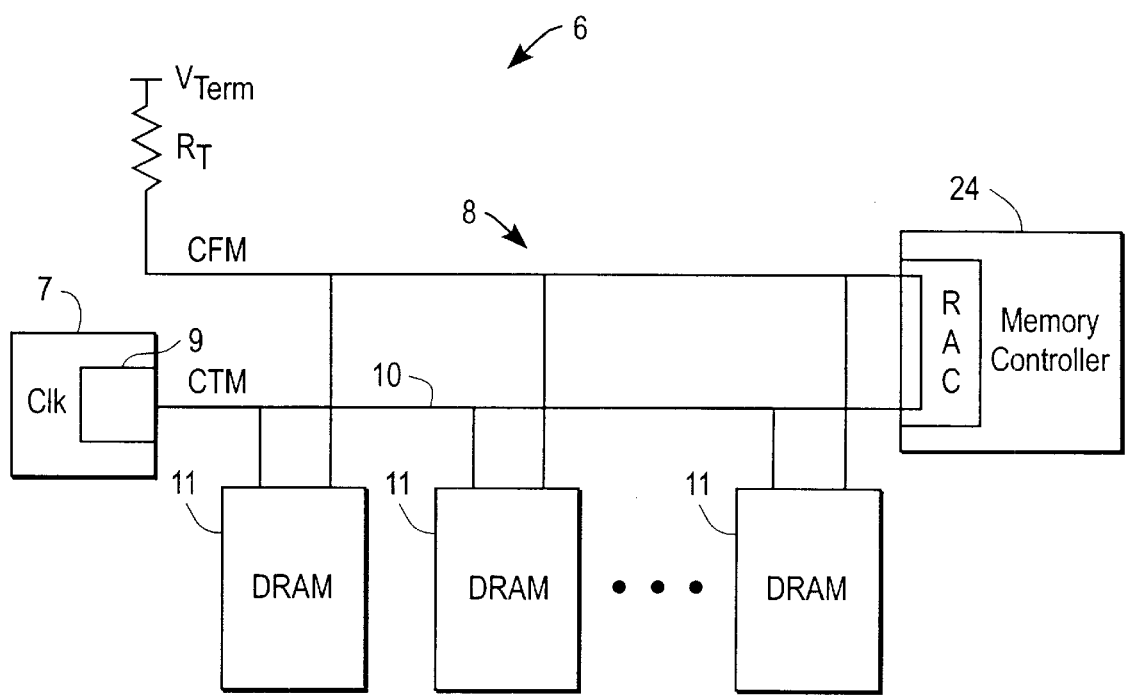
FIG. 2 is a block diagram of a prior art memory system, including a plurality of DRAMs, a memory controller, a clock chip and a clock line.
Figure 3:
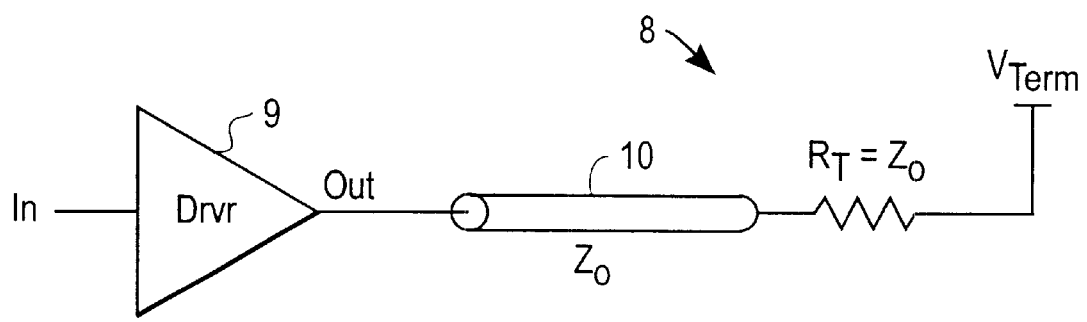
FIG. 3 is a simplified electrical model of the single-ended clock driver of FIG. 2.
Figure 4:
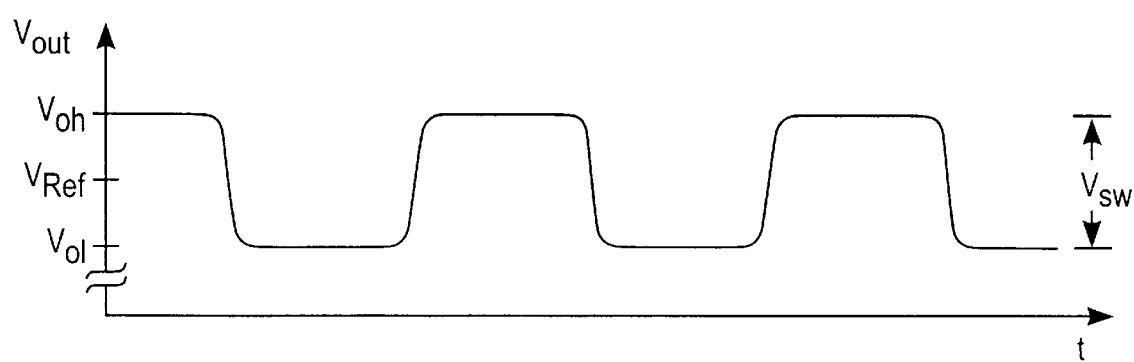
FIG. 4 is a waveform diagram illustrating the output voltage waveform generated by the clock driver of FIG. 3 as a function of time.
Figure 5:
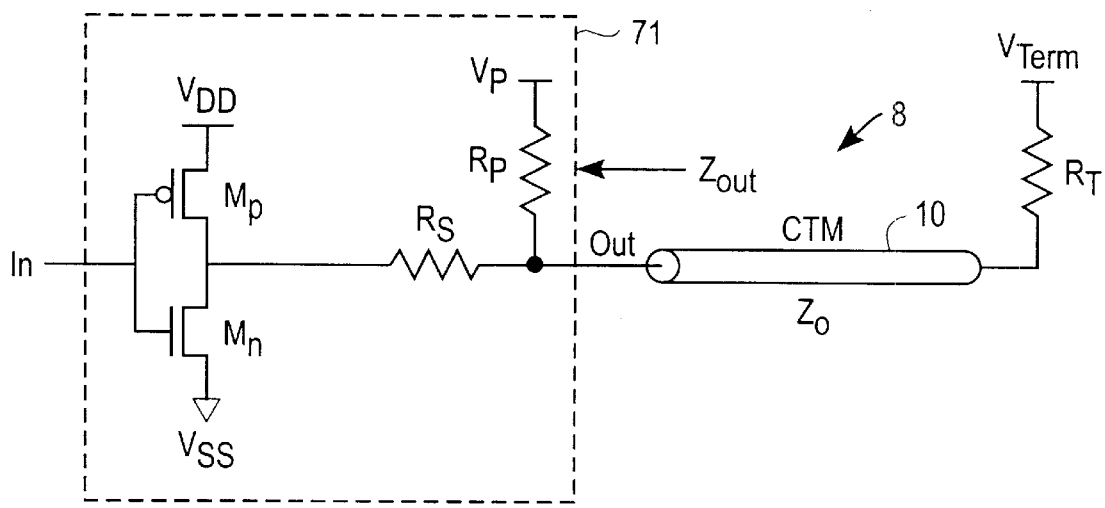
FIG. 5 is a circuit diagram of a single-ended clock driver in accordance with the present invention.

FIG. 5 shows a single-ended clock driver circuit 71 in accordance with the present invention. The clock driver circuit 71 has an input In for receiving an input clock signal. The clock driver circuit 71 also has an output Out for generating a single-ended clock signal CTM. The output Out is connected to the clock line 8, which as described in the background section above, has a loaded impedance of $Z_0$.

The clock driver circuit 71 further includes a p-channel transistor $M_p$ and an n-channel transistor $M_n$ configured as a CMOS inverter. The p-channel transistor $M_p$ includes a source connected to a power supply $V_{DD}$, a drain, and a gate connected to the input In. The n-channel transistor $M_n$ includes a drain connected to the drain of the p-channel transistor $M_p$, a source connected to a ground supply $V_{SS}$ and a gate connected to the input In.

The clock driver circuit 71 additionally includes a passive network composed of a series resistor $R_s$ and a parallel resistor $R_p$. A first end of the series resistor $R_s$ is connected to the output of the CMOS inverter, i.e., the drains of the transistors $M_p$ and $M_n$. A second end of the series resistor $R_s$ is connected to the output Out of the clock driver circuit 71. A first end of the parallel resistor $R_p$ is connected to the output Out of the clock driver circuit 71. A second end of the parallel resistor $R_p$ is connected to a voltage source $V_p$. The voltage source $V_p$ may comprise any voltage supply, such as $V_{DD}$. The resistors $R_s$ and $R_p$ may be formed from either discrete components or devices integrated on the same substrate as the transistors $M_p$ and $M_n$. In the preferred embodiment, $V_{Term} \geq V_{DD}$ and $V_p = V_{Term}$.

Optionally, the clock driver circuit 71 may include two predriver circuits (not shown), one predriver circuit connected between the input In and the gate of the transistor $M_p$ and the other predriver circuit connected between the input In and the gate of the transistor $M_n$. The predriver circuits minimize the wasted "shoot-through" current passing through the transistors $M_p$ and $M_n$ during transitions of the clock signal CTM by skewing the timing of the signals fed to the transistors $M_p$ and $M_n$. The operation of predriver circuits are described in further detail below with respect to the clock driver circuit 15.

The clock driver circuit 71 may be used to construct a quasi-differential clock driver circuit by placing two clock driver circuits 71 in parallel. Complementary input signals are fed to the inputs of the two clock driver circuits to produce a differential clock signal at the circuit outputs.

The output impedance $Z_{out}$ of the clock driver circuit 71 is given by the equation:

$$Z_{out} = R_p \| [R_s + (1/G_{ds,p} \| 1/G_{ds,n})],$$

where $G_{ds,p}$ and $G_{ds,n}$ are the drain-to-source conductances of the transistors $M_p$ and $M_n$, respectively, and the symbol "$\|$" means "in parallel with" such that $R_1 \| R_2 = (R_1 * R_2)/(R_1 + R_2)$. The drain-to-source resistances $1/G_{ds,p}$ and $1/G_{ds,n}$ may vary significantly during circuit operation, reaching into the thousands of ohms when the transistors are operating in the saturation region, as discussed below with respect to the clock driver circuit 25. As seen from the equation, however, the parallel resistor $R_p$ limits the maximum output impedance $Z_{out}$ to $R_p$. As a result, the variation in the output impedance $Z_{out}$ is relatively well-controlled. By selecting the appropriate values for $R_p$, $R_s$, $G_{ds,p}$ and $G_{ds,n}$, the output impedance $Z_{out}$ can thus be closely matched to the loaded impedance $Z_0$ of the clock line 8. These values may be determined using a design procedure similar to that given below with respect to the clock driver circuit 15.

Figure 6:
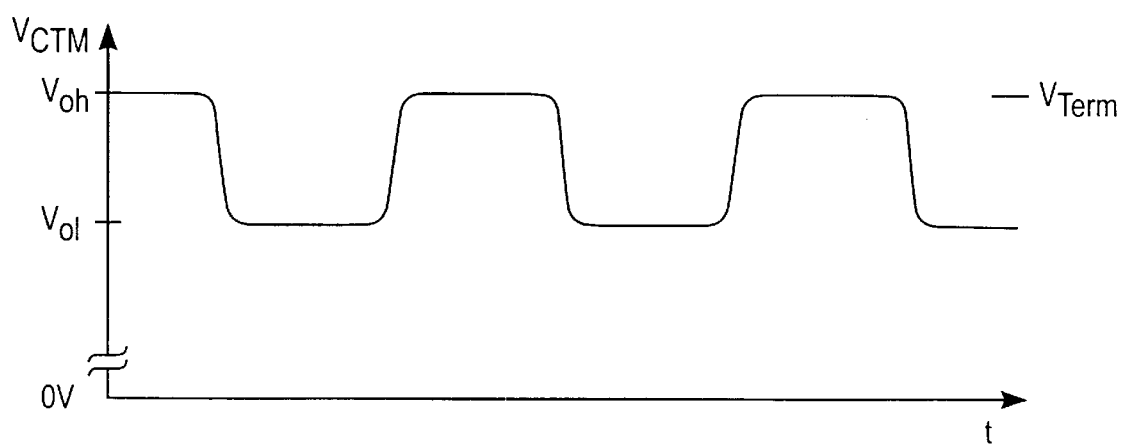
FIG. 6 is a waveform diagram illustrating the output voltage waveform generated by the clock driver of FIG. 5 as a function of time.

FIG. 6 illustrates the waveform of the signal CTM generated by the clock driver circuit 71 as a function of time. The signal CTM has a high voltage level $V_{oh}$ equal to the termination voltage $V_{Term}$ and a low voltage level $V_{ol}$ that is greater than $V_{SS}$. The voltage of the signal CTM is thus always fairly high (i.e., near $V_{DD}$). Consequently, the p-channel transistor $M_p$ operates in either the linear or cut-off regions of operation, but not in saturation. The p-channel transistor $M_p$ thus provides very little pull-up current; it is merely used to provide good $R_{out}$ impedance matching when the n-channel transistor $M_n$ is off during every other half clock cycle. Because the p-channel transistor $M_p$ does not operate in the saturation region, the variation in the output impedance $Z_{out}$ during circuit operation is further reduced.

The clock driver circuit 71 is particularly advantageous for use with the combination of relatively low power supply voltages (e.g., $V_{DD} \leq 1.8$ V) and higher $V_{Term}$ voltages (e.g., $V_{Term} \geq 1.8$ V). At these low power supply voltages, the p-channel transistor $M_p$ provides very little pull-up current. Nevertheless, the performance of the clock driver circuit 71 is not significantly degraded because the circuit primarily uses the parallel resistor $R_p$, not the p-channel transistor $M_p$, to pull up the clock line 8. The variation in the output impedance $Z_{out}$ is even further reduced at these low voltages because the operation of the p-channel transistor $M_p$ is always linear.

Figure 7:
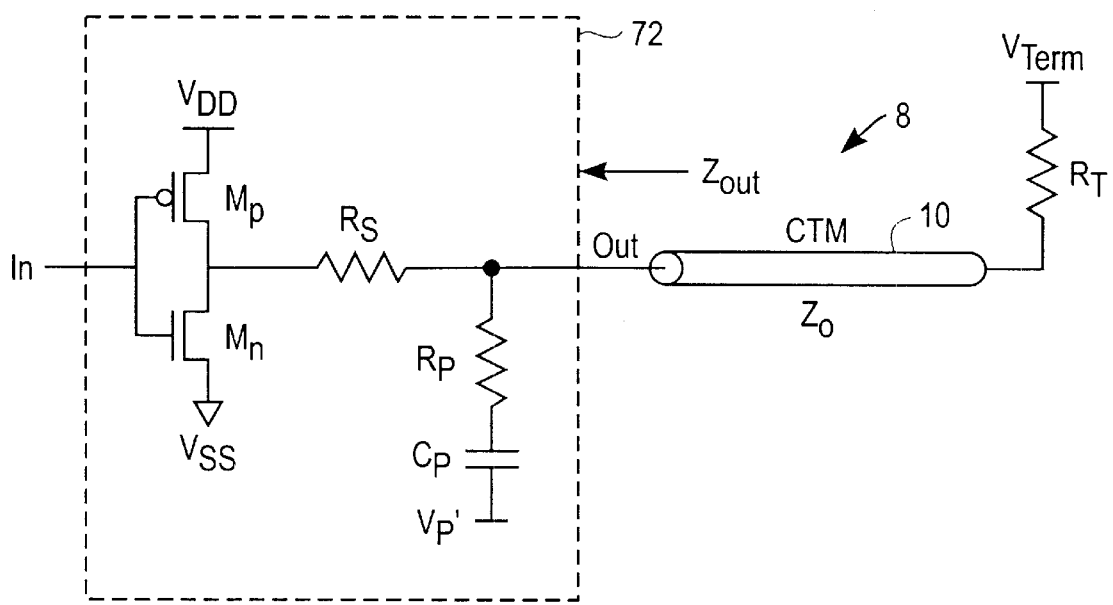
FIG. 7 is a circuit diagram of a single-ended clock driver in accordance with a second alternate embodiment of the present invention.

FIG. 7 shows an alternative embodiment of a single-ended clock driver circuit in accordance with the present invention. Clock driver circuit 72 is identical to the clock driver circuit 71 shown in FIG. 5 except that the second end of the parallel resistor $R_p$ is connected to a voltage supply $V_p'$ through a capacitor $C_p$. The voltage source $V_p'$ may comprise any voltage supply, such as $V_{DD}$ or Gnd. The capacitor $C_p$ provides an AC ground connection to the voltage source $V_p'$ for the parallel resistor $R_p$. By coupling the parallel resistor $R_p$ to an AC ground, the common-mode voltage of the clock signal CTM is not affected by the voltage source $V_p'$.

Figure 8:
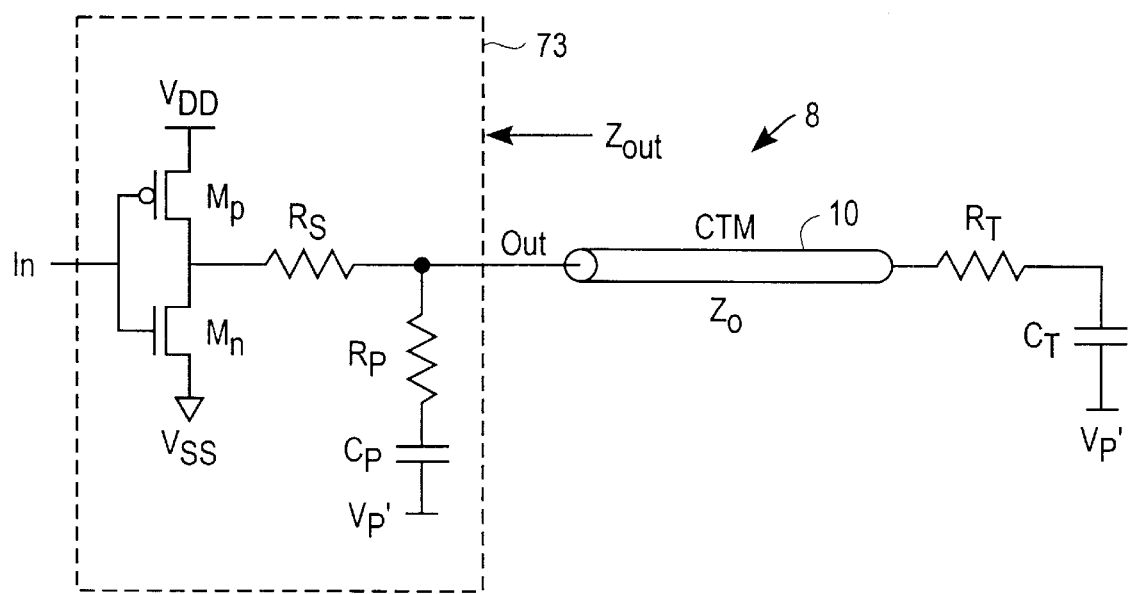
FIG. 8 is a circuit diagram of a single-ended clock driver in accordance with an alternate embodiment of the present invention.

FIG. 8 shows a second alternative embodiment of a single-ended clock driver circuit in accordance with the present invention. Clock driver circuit 73 is identical to the clock driver circuit 72 shown in FIG. 7 except that the termination resistor $R_T$ is connected to the voltage supply $V_p'$ through a capacitor $C_T$. The function of the capacitor $C_T$ is similar to that of the capacitor $C_p$, i.e., the capacitor $C_T$ provides an AC ground connection to the voltage source $V_p'$ for the termination resistor $R_T$.

The capacitors $C_P$ and $C_T$ of clock driver should be set to a sufficiently large capacitance such that:

$$X_{Cp} = 1/(2*\pi*f*C_p) << R_p, \text{ and}$$
$$X_{CT} = 1/(2*\pi*f*C_T) << R_T,$$

where f is the frequency of the output signal CTM.

The single-ended clock driver circuits described above provide a well-controlled output impedance, thereby minimizing the secondary reflections at the output that contribute to clock jitter. However, these clock driver circuits still rely on the voltage signals $V_{Term}$ and $V_{Ref}$ to generate clock signals and thus are still susceptible to clock jitter.

To further reduce the susceptibility to clock jitter, an alternate embodiment of the present invention employs a clock driver that generates a differential, rather than a single-ended, clock signal. A differential clock signal includes two signals that vary over time in a symmetrical but complementary manner about a common-mode voltage. A single-ended clock signal may be derived from the differential clock signal by measuring the difference in voltage between the two signals.

A clock driver that generates a differential clock signal provides several advantages over a driver that generates a single-ended clock signal. First, the internal clock signal that is derived from the differential clock signal is cleaner and has less clock jitter because the noise-prone voltage sources $V_{Term}$ and $V_{Ref}$ are not used to generate either the differential clock signal or the internal single-ended clock signal that is derived from it. Second, the differential clock driver needs to generate an output voltage swing that is only half as large as the single-ended clock driver to produce a clock signal of equivalent amplitude.

Figure 9:
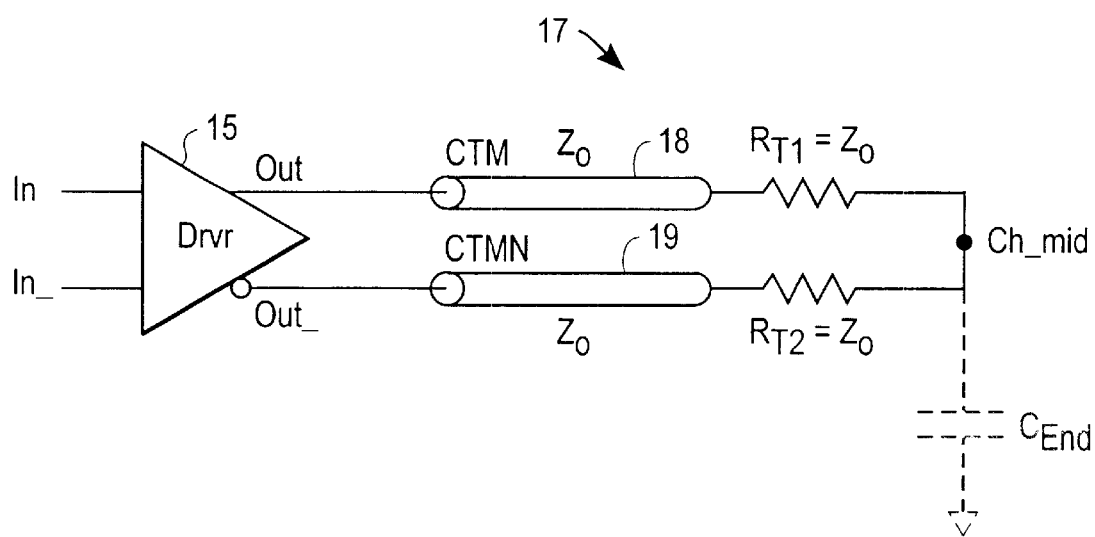
FIG. 9 is a simplified electrical model of a differential clock driver in accordance with the present invention.

FIG. 9 is a simplified electrical model of a differential clock driver 15 and a pair of differential clock lines 17 in accordance with the present invention. The differential clock driver 15 includes two inputs, In and In_, for receiving a periodic binary signal and the complement of the periodic binary signal, respectively, generated by an oscillator circuit (not shown). The differential clock driver 15 also includes two outputs, Out and Out_, for generating the differential signals CTM and CTMN, respectively. The signal CTM is generated from the periodic binary signal received by the input In, while the signal CTMN is generated from the periodic binary signal received by the input In_. The signals CTM and CTMN together comprise the differential clock signal generated by the differential clock driver 15.

The pair of differential clock lines 17 includes two conductors 18 and 19 for transmitting the differential signals CTM and CTMN, respectively. Each of the differential clock lines is represented by a transmission line of loaded impedance $Z_0$. The loaded impedance $Z_0$ includes the unloaded characteristic impedance $Z_0'$ of the respective conductor 18 or 19 as well as the impedance of any devices, such as DRAMs 11, connected to the conductor. An internal clock generating circuit (see FIG. 12) contained in each such device converts the differential signals CTM and CTMN into a single-ended internal clock signal for use within the device.

The differential clock lines 17 also include two termination resistors $R_{T1}$ and $R_{T2}$. A first end of each termination resistor $R_{T1}$ and $R_{T2}$ is connected to the end of the respective conductor 18 or 19 opposite the end connected to the clock driver 15. A second end of the termination resistor $R_{T1}$ is connected to a second end of the termination resistor $R_{T2}$ at a node Ch_mid to form an electrical connection between conductors 18 and 19. Assuming the signals CTM and CTMN are truly differential, i.e., the signals are 180 degrees out-of-phase with each other, the node Ch_mid will appear as a differential ground with the conductors 18 and 19 being terminated with the termination resistors $R_{T1}$ and $R_{T2}$, respectively. The termination resistors $R_{T1}$ and $R_{T2}$ prevent reflections of the differential signals CTM and CTMN from occurring at the end of the conductors 18 and 19, respectively. In order to minimize the signal reflections, the resistance of the termination resistors $R_{T1}$ and $R_{T2}$ is set to equal the loaded impedance $Z_0$ of the differential clock lines 17. Optionally, a capacitor $C_{End}$ is connected between the node Ch_mid and a power supply (as shown by the dotted lines in FIG. 9) to reinforce the differential ground.

Figure 10:
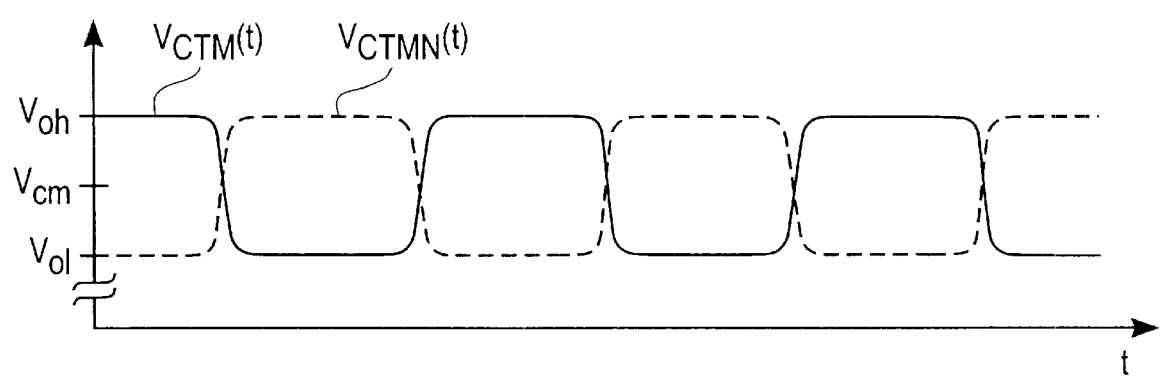
FIG. 10 is a waveform diagram illustrating the output voltage waveforms generated by the clock driver of FIG. 9 as a function of time.

FIG. 10 illustrates the waveforms of the differential signals CTM and CTMN generated by the clock driver circuit 15 as a function of time. The signals CTM and CTMN are preferably complementary, i.e., 180 degrees out of phase with each other, as shown in the figure. However, the signals CTM and CTMN will be complementary only if the periodic binary signals supplied to the inputs In and In_ of the clock driver circuit 15 are also complementary. The signals CTM and CTMN each have a high voltage level $V_{oh}$, a low voltage level $V_{ol}$ and a common mode voltage $V_{cm}$. The common mode voltage $V_{cm}$ is the average voltage of the signal, which ideally is identical for the signals CTM and CTMN as shown in the figure.

Figure 11:
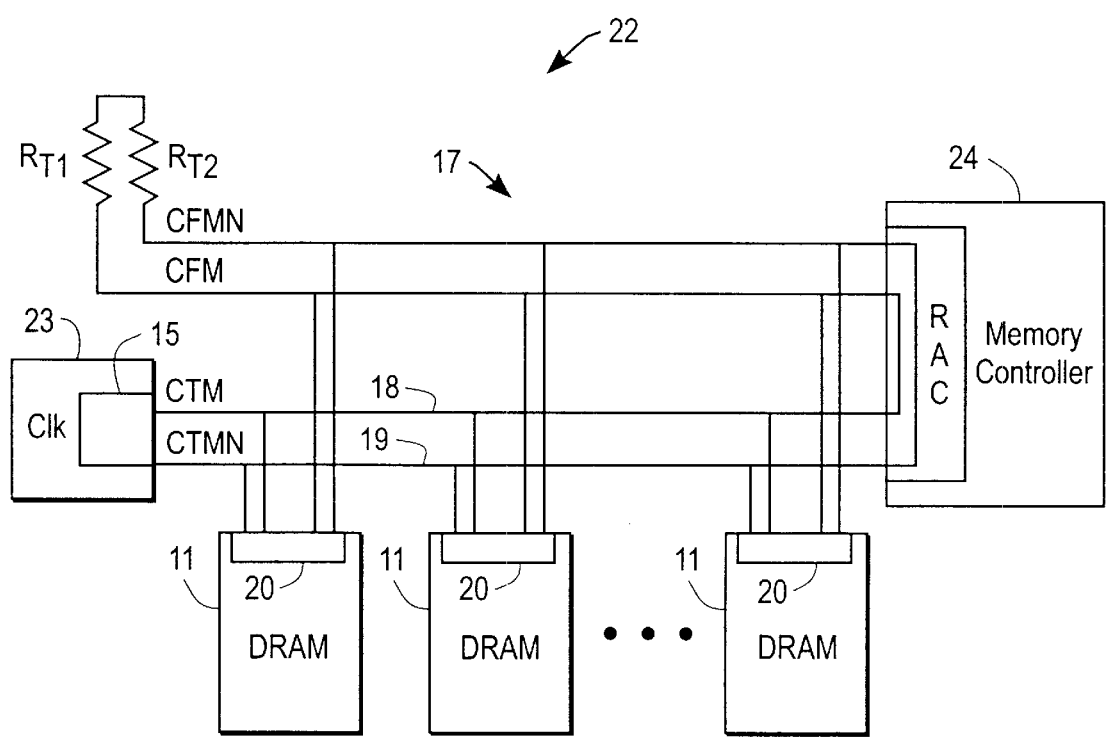
FIG. 11 is a block diagram of a memory system in accordance with the present invention, including a plurality of DRAMs, a memory controller, a clock chip and differential clock lines.

FIG. 11 is a block diagram of a memory system 22 employing the differential clock driver circuit 15 of the present invention. The memory system 22 includes differential clock lines 17, a plurality of DRAMs 11 and a memory controller 24. The figure does not show data busses or other aspects of the memory system 22 not relevant to the present invention. The conductors 18 and 19 of the differential clock lines 17 pass through the memory controller 24 such that the conductors are divided into two portions: a CTM/CTMN (clock to master) portion and a CFM/CFMN (clock from master) portion. The CTM/CTMN portion propagates the clock signal from the clock driver circuit 15 towards the memory controller 24. The CFM/CFMN portion propagates the clock signal from the memory controller 24 towards the DRAMs 11. The DRAMs 11 are connected to both the CTM/CTMN and CFM/CFMN portions of the conductors 18 and 19. An internal clock generating circuit 20 is contained in each DRAM 11 that converts the differential clock signal into a single-ended internal clock signal for use within the DRAM. As mentioned in the background section, the conductors 18 and 19 are divided in this manner so that the clock signal can maintain a certain phase relationship with the data signals transmitted between the DRAMs 11 and the memory controller 24 as the signals propagate, regardless of whether the data signals are transmitted from the DRAMs to the memory controller or vice versa.

Figure 12:
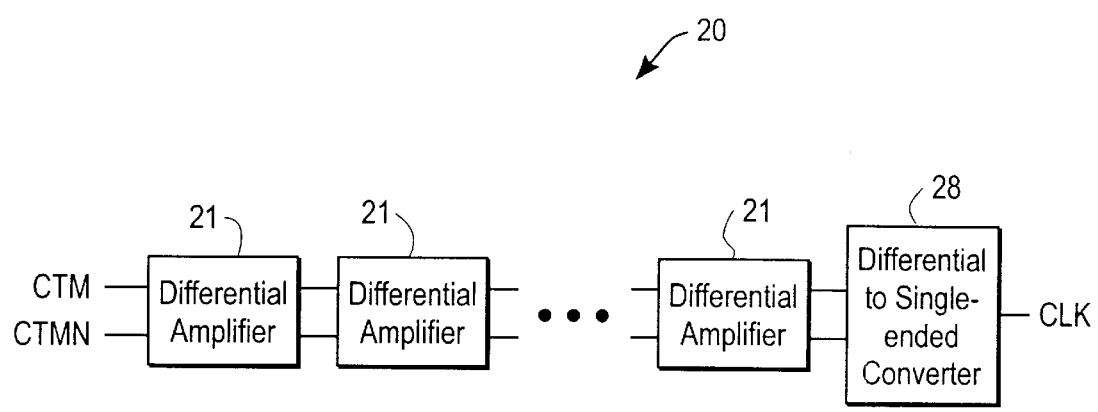
FIG. 12 is a block diagram of an internal clock generating circuit for use in the DRAMs of FIG. 11.

FIG. 12 is a block diagram of an embodiment of the internal clock generating circuit 20 contained within each of the DRAMs 11. The internal clock generating circuit 20 includes one or more differential amplifiers 21 in series to amplify the differential clock signal CTM/CTMN. The internal clock generating circuit 20 also includes a differential to single-ended converter 28 connected to the output of the differential amplifiers to convert the amplified differential clock signal into a single-ended clock signal CLK.

The differential clock driver circuit 15 of the present invention will be described in further detail below. To provide a greater appreciation for the advantages of the present invention, however, design considerations for a differential clock driver circuit along with several alternative designs will now be described. A differential clock driver circuit should provide the following features for optimum operation: (1) an appropriate voltage swing $V_{sw}$ and common mode voltage $V_{cm}$ for the differential clock signal and (2) an output impedance that closely matches the loaded impedance of the differential clock lines to prevent secondary reflections from occurring at the output of the driver.

Figure 13:
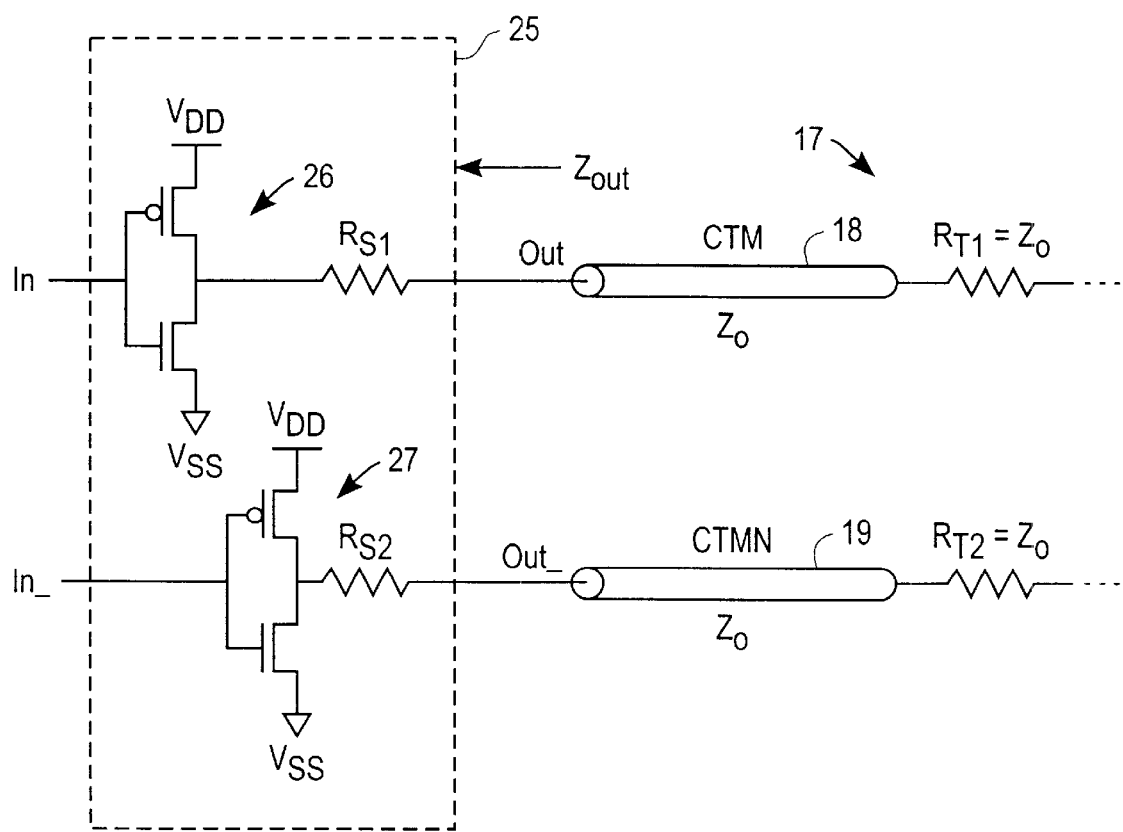
FIG. 13 is a circuit diagram of a first alternative design for a differential clock driver.

FIG. 13 is a circuit diagram of a first alternative design for a differential clock driver. The clock driver circuit 25 is actually a "quasi-differential" clock driver circuit because its operation approximates that of a true differential circuit. A true differential clock driver supplies two output signals which always swing in a complementary fashion about a common-mode voltage $V_{cm}$ in response to an input signal. By contrast, the output signals of the quasi-differential clock driver circuit 25 will swing in a complementary fashion about a common-mode voltage $V_{cm}$, only if its two inputs, In and In_, are driven by complementary signals (i.e., signals which differ in phase by 180 degrees). If the quasi-differential clock driver circuit 25 is driven with input signals that are not complementary, the circuit will generate output signals that are likewise not complementary and thus will not operate in the same manner as a true differential circuit.

Continuing to refer to FIG. 13, quasi-differential clock driver circuit 25 includes two complementary metal-oxide semiconductor (CMOS) inverter circuits 26 and 27. The inverter circuits 26 and 27 include inputs In and In_, respectively, which receive complementary binary signals. The clock driver circuit 25 further includes two series resistors $R_{s1}$ and $R_{s2}$ that are connected between the outputs of inverter circuits 26 and 27, respectively, and the conductors 18 and 19 of the differential clock lines 17, respectively. The resistances of series resistors $R_{s1}$ and $R_{s2}$ are set to $Z_0-1/G_{ds}$, where $Z_0$ is the loaded impedance of the differential clock lines 17 and $G_{ds}$ is the small-swing drain-to-source conductance of the p-channel or n-channel (field effect) transistors in the CMOS inverter circuits 26 and 27 when they are fully turned on. In this manner, the output impedance $Z_{out}$ of the clock driver circuit 25 equals the impedance $Z_0$ of the differential clock lines 17 whenever the output signals CTM and CTMN are not transitioning (i.e., when they are at $V_{oh}$ or $V_{ol}$). Because of the matching impedance, secondary reflections at the clock driver circuit 25 are suppressed during steady-state conditions.

Figure 14:
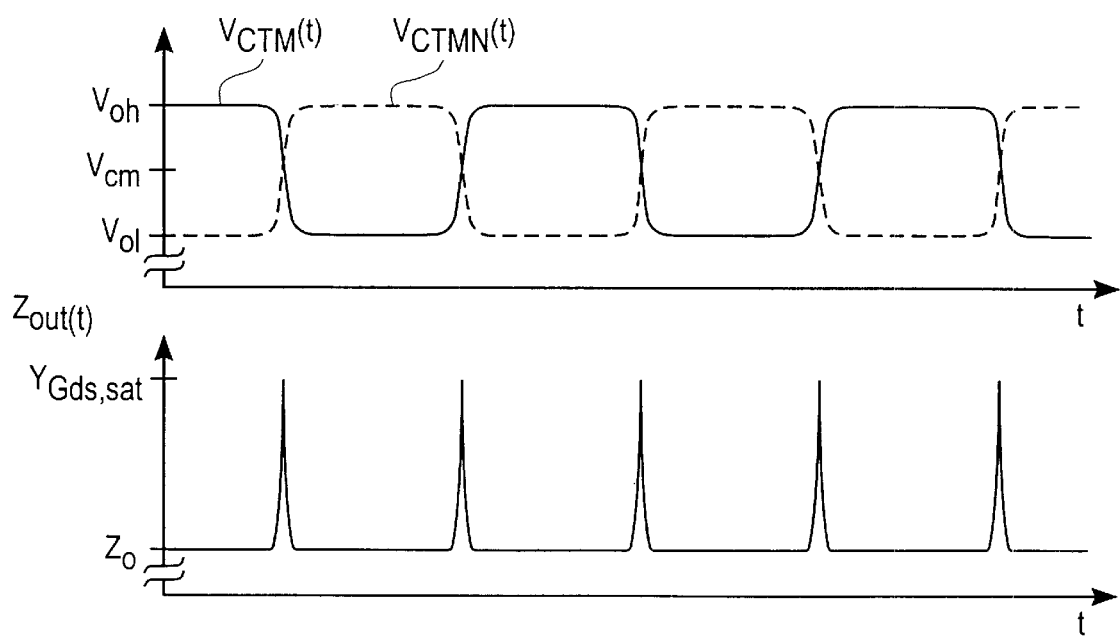
FIG. 14 is a diagram illustrating the output voltage waveforms and output impedance of the clock driver of FIG. 13 as a function of time.

Whenever the output signals CTM and CTMN are transitioning between $V_{ol}$ and $V_{oh}$, however, the clock driver circuit 25 does not provide a good impedance match to the differential clock lines 17. During these transitions, the transistors of the inverter circuits 26 and 27 move into the saturation region of operation, thereby causing the small-swing resistance $1/G_{ds}$ of the transistors to increase dramatically to $1/G_{ds,sat}$, which is often well into the thousands of ohms. Since the output impedance $Z_{out}$ of the clock driver circuit 25 is composed of the drain-to-source resistance $1/G_{ds}$ of the p-channel or n-channel transistor in series with the series resistor $R_{s1}$ or $R_{s2}$, the output impedance $Z_{out}$ will also be very high. The variation in the output impedance $Z_{out}$ of the clock driver circuit 25 in relation to the output signals CTM and CTMN is illustrated in FIG. 14. Because the output impedance $Z_{out}$ no longer matches the loaded impedance $Z_0$ of the differential clock lines 17, secondary reflections may occur during transitions of the signals CTM and CTMN.

Another disadvantage of the clock driver circuit 25 is that it outputs the signals CTM and CTMN with a reduced voltage swing $V_{sw}$. This is because the series resistors $R_{s1}$ and $R_{s2}$ form a voltage divider with the loaded impedance $Z_0$ of the differential clock lines 17, thereby reducing the maximum voltage that can be output by the clock driver circuit 25.

Yet another disadvantage of the clock driver circuit 25 is that the common mode voltage $V_{cm}$ of the output signals CTM and CTMN cannot be adjusted easily. The common mode voltage $V_{cm}$ is fixed at $V_{cm}=0.5*(V_{DD}+V_{SS})$ by the output of the inverters 26 and 27. Therefore, the common mode voltage $V_{cm}$ cannot be varied without changing the supply voltages $V_{DD}$ or $V_{SS}$, which is usually impractical.

The clock driver circuit 25 thus suffers from two shortcomings: (1) a poor impedance match to the differential clock lines 17 during output signal transitions and (2) an inability to set an arbitrary voltage swing $V_{sw}$ or common mode voltage $V_{cm}$.

Figure 15:
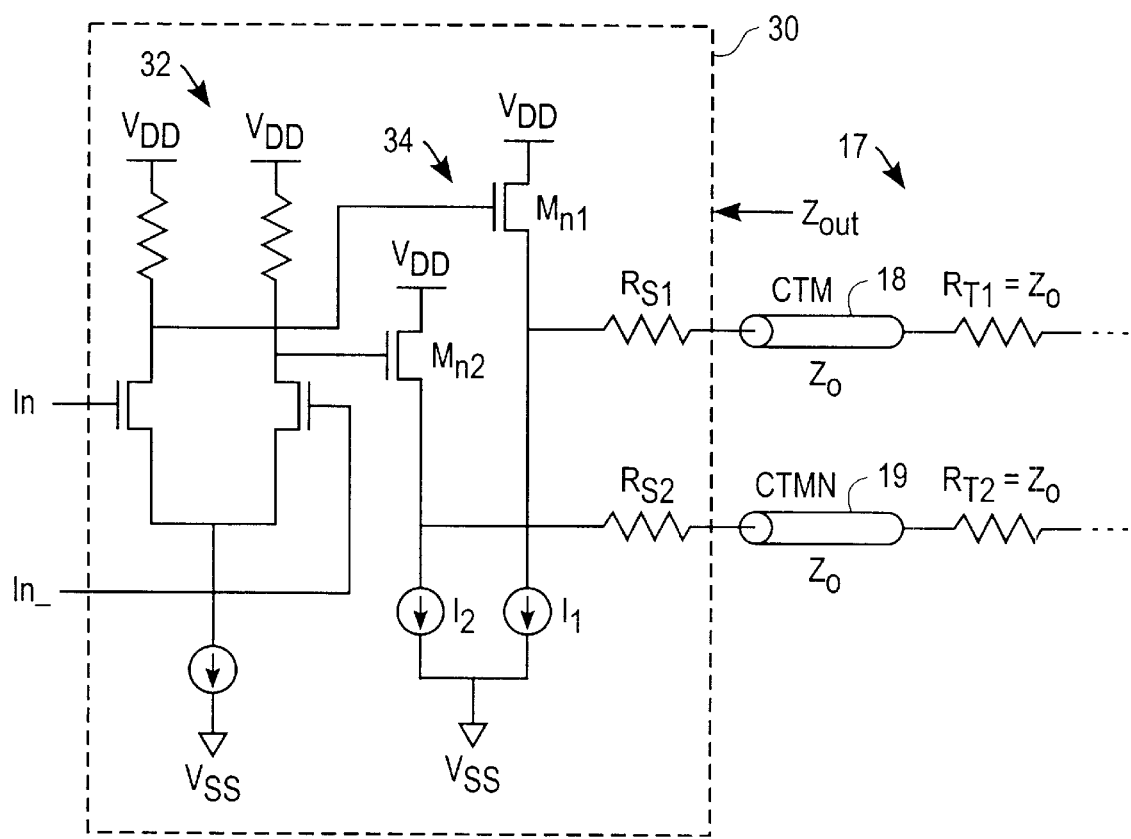
FIG. 15 is a circuit diagram of a second alternative design for a differential clock driver.

FIG. 15 is a circuit diagram of a second alternative design for a differential clock driver. Differential clock driver circuit 30 includes a differential pair predriver 32 followed by a differential common-drain stage 34. The differential pair predriver 32 includes inputs In and In_ which receive complementary binary signals. The differential common-drain stage 34 includes two n-channel MOS transistors $M_{n1}$ and $M_{n2}$ that are each connected between the power supply $V_{DD}$ and a respective differential output of the common-drain stage. The differential common-drain stage 34 also includes two current sources $I_1$ and $I_2$ that are connected between the respective differential output of the common-drain stage and a ground supply $V_{SS}$. The current sources $I_1$ and $I_2$ bias the transistors $M_{n1}$ and $M_{n2}$ so that the source conductance $G_m$ of the transistors does not vary substantially over the entire output voltage range of the common-drain stage 34.

The differential clock driver circuit 30 also includes two series resistors $R_{s1}$ and $R_{s2}$ that are connected between the two outputs of the differential common-drain stage 34 and the conductors 18 and 19 of the differential clock lines 17, respectively. The resistances of the series resistors $R_{s1}$ and $R_{s2}$ are set to $Z_0-1/G_m$, where $Z_0$ is the loaded impedance of the differential clock lines 17. In this manner, the output impedance $Z_{out}$ of the clock driver circuit 30 equals the impedance $Z_0$ of the differential clock lines 17. Unlike the clock driver circuit 25 described earlier, however, the output impedance $Z_{out}$ of the clock driver circuit 30 has little variation during circuit operation because of the well-controlled conductance $G_m$ of the transistors $M_{n1}$ and $M_{n2}$. As a result, the clock driver circuit 30 maintains a good impedance match with the differential clock lines 17 at all times, thereby suppressing secondary reflections more effectively than the clock driver 25.

Unfortunately, the clock driver circuit 30 also suffers from several disadvantages. One disadvantage is that the clock driver circuit 30 consumes a large amount of power. The power consumption of the clock driver circuit 30 is high because the current sources $I_1$ and $I_2$ must sink a relatively large current in order to ensure that the conductance $G_m$ of the transistors $M_{n1}$ and $M_{n2}$ does not vary significantly over the entire output voltage range of the common-drain stage 34.

Another disadvantage of the clock driver circuit 30 is that the maximum common mode voltage $V_{cm}$ and high voltage level $V_{oh}$ it is capable of generating is relatively low. This is because the n-channel transistors $M_{n1}$ and $M_{n2}$ limit the maximum voltage that can be generated at the outputs of the common-drain stage 34 to $V_{DD}-V_{gs,on}$, where $V_{gs,on}$ is the gate-to-source voltage of the transistors $M_{n1}$ and $M_{n2}$ when turned on. Moreover, the voltage $V_{gs,on}$ can be fairly large because of the body effect experienced by the transistors $M_{n1}$ and $M_{n2}$ and the high current sunk by the current sources $I_1$ and $I_2$.

Yet another disadvantage of the clock driver circuit 30 is that it generates output signals having highly asymmetrical rising and falling edges. The signal edges are asymmetrical because the common-drain stage 34 provides an active pull-up (through the transistors $M_{n1}$ and $M_{n2}$) and a passive pull-down (through the current sources $I_1$ and $I_2$).

Therefore, although the clock driver circuit 30 is an improvement over the previously described clock driver circuit 25, it suffers from three other shortcomings: (1) a relatively high power consumption, (2) an output signal having a relatively low maximum common mode voltage $V_{cm}$ and high voltage level $V_{oh}$ and (3) an output signal with asymmetrical edge rates.

Figure 16:
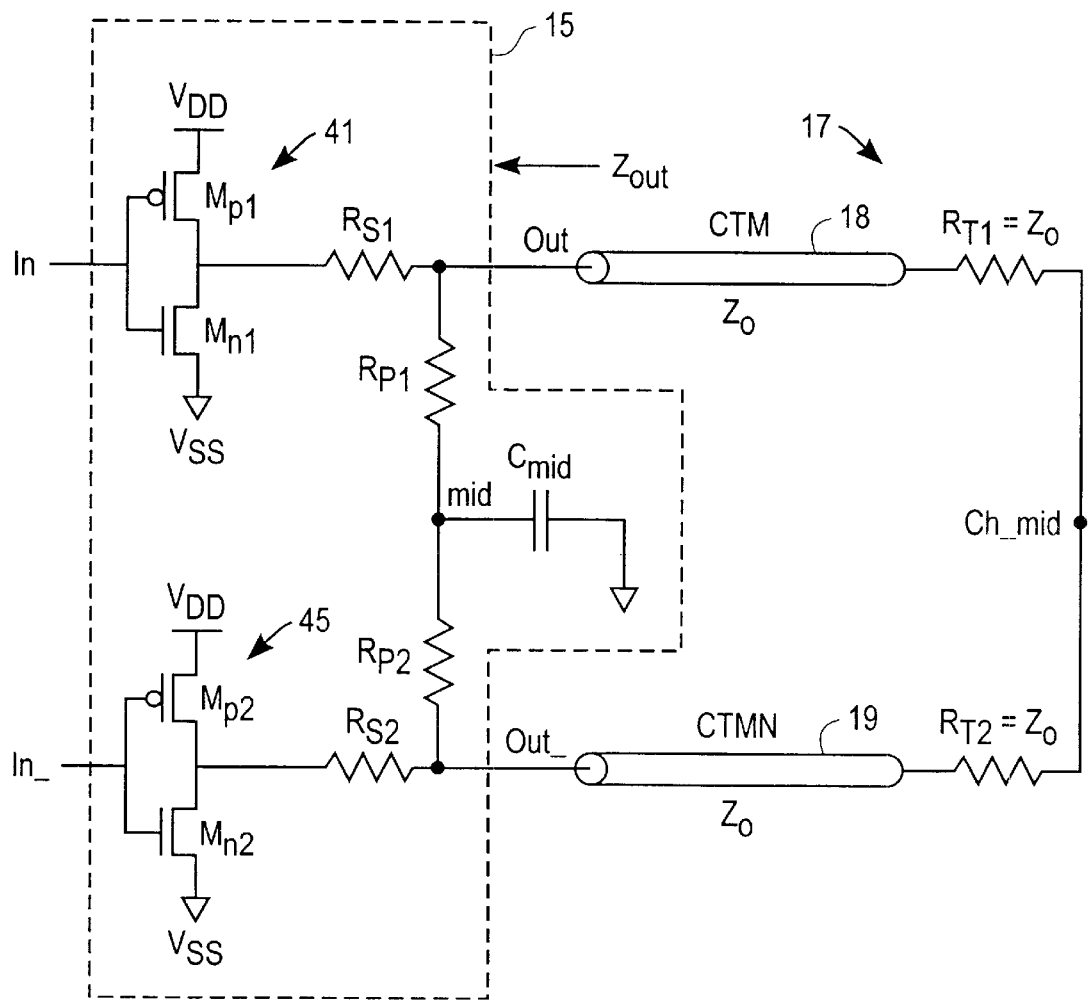
FIG. 16 is a circuit diagram of a quasi-differential clock driver in accordance with the present invention.

Having illustrated two alternative designs for a differential clock driver circuit, a differential clock driver circuit in accordance with the present invention will now be described. FIG. 16 is a circuit diagram of the quasi-differential clock driver circuit 15 and the differential clock lines 17 shown earlier in FIG. 9. As mentioned earlier, the quasi-differential clock driver circuit 15 has two inputs, In and In_ for receiving complementary binary signals. As also discussed, the clock driver circuit 15 has two outputs Out and Out__ for generating the differential signals CTM and CTMN, respectively, which together comprise the differential clock signal.

The clock driver circuit 15 includes two CMOS inverters 41 and 45. The CMOS inverter 41 includes a p-channel transistor $M_{p1}$ and an n-channel transistor $M_{n1}$. The p-channel transistor $M_{p1}$ includes a source connected to the power supply $V_{DD}$, a drain, and a gate connected to the input In. The n-channel transistor $M_{n1}$ includes a drain connected to the drain of the p-channel transistor $M_{p1}$, a source connected to the ground supply $V_{SS}$ and a gate connected to the input In. Similarly, the CMOS inverter 45 includes a p-channel transistor $M_{p2}$ and an n-channel transistor $M_{n2}$. The p-channel transistor $M_{p2}$ includes a source connected to the power supply $V_{DD}$, a drain, and a gate connected to the input In__. The n-channel transistor $M_{n2}$ includes a drain connected to the drain of the p-channel transistor $M_{p2}$, a source connected to the ground supply $V_{SS}$ and a gate connected to the input In__. In the preferred embodiment, the transistors $M_{p1}$ and $M_{n1}$ of the inverter 41 are of equal size (i.e., channel width and length) to the respective transistors $M_{p2}$ and $M_{n2}$ of the inverter 45 so that the clock driver circuit 15 is symmetrical. In this embodiment, the drain-to-source conductances $G_{ds,p}$ of the p-channel transistors $M_{p1}$ and $M_{p2}$ are equal and the drain-to-source conductances $G_{ds,n}$ of the n-channel transistors $M_{n1}$ and $M_{n2}$ are also equal.

The clock driver circuit 15 also includes two series resistors $R_{s1}$ and $R_{s2}$. A first end of the series resistor $R_{s1}$ is connected to the output of the inverter 41, i.e., the drains of the transistors $M_{p1}$ and $M_{n1}$. A second end of the series resistor $R_{s1}$ is connected to the output Out of the clock driver circuit 15. Similarly, a first end of the series resistor $R_{s2}$ is connected to the output of the inverter 45, i.e., the drains of the transistors $M_{p2}$ and $M_{n2}$. A second end of the series resistor $R_{s2}$ is connected to the output Out__ of the clock driver circuit 15. Preferably, the series resistors $R_{s1}$ and $R_{s2}$ are of equal resistance $R_s = R_{s1} = R_{s2}$ so that the clock driver circuit 15 is symmetrical.

The clock driver circuit 15 further includes two parallel resistors $R_{p1}$ and $R_{p2}$. A first end of the parallel resistor $R_{p1}$ is connected to the output Out of the clock driver circuit 15. A second end of the parallel resistor $R_{p1}$ is connected to a node labeled "mid." Similarly, a first end of the parallel resistor $R_{p2}$ is connected to the output Out__ of the clock driver circuit 15. A second end of the parallel resistor $R_{p2}$ is connected to the mid node. Preferably, the parallel resistors $R_{p1}$ and $R_{p2}$ are of equal resistance $R_p = R_{p1} = R_{p2}$ so that the clock driver circuit 15 is symmetrical. If the clock driver circuit 15 is symmetrical, the mid node acts as a differential ground provided that a truly complementary signal is supplied to the inputs In and In__.

The clock driver circuit 15 may optionally include a capacitor $C_{mid}$. A first end of the capacitor $C_{mid}$ is connected to the mid node. A second end of the capacitor $C_{mid}$ is connected to a stable voltage supply such as the ground supply $V_{SS}$. The capacitor $C_{mid}$ reinforces the differential ground at the mid node, preventing the node from temporarily drifting from the common mode potential, by providing a low impedance AC path from the node to the ground supply. The mid node may drift from the common mode potential for two reasons: (1) small imbalances may exist between the two sides of the clock driver circuit 15; for example, slight differences in the value of $R_{p1}$ and $R_{p2}$, and (2) the input signals In and In__ may not be perfectly complementary due to small timing skews between the signals.

The series resistors $R_{s1}$ and $R_{s2}$, the parallel resistors $R_{p1}$ and $R_{p2}$ and the capacitor $C_{mid}$ of the clock driver circuit 15 may be formed from either discrete components or devices integrated on the same substrate as the transistors $M_{p1}$, $M_{p2}$, $M_{n1}$ and $M_{n2}$.

The clock driver circuit 15 provides a well-controlled output impedance $Z_{out}$ that can be closely matched to the loaded impedance $Z_0$ of the differential clock lines 17. Assuming that the mid node is a differential ground node, the output impedance $Z_{out}$ of the clock driver circuit 15 is expressed as:

$$Z_{out} = R_p \| [R_s + (1/G_{ds,p} \| 1/G_{ds,n})],$$

where $R_p = R_{p1} = R_{p2}$, $R_s = R_{s1} = R_{s2}$ and the symbol "$\|$" means "in parallel with" such that $R_1 \| R_2 = (R_1 * R_2)/(R_1 + R_2)$. When the output Out is at the voltage $V_{oh}$, the expression simplifies to:

$$Z_{out} = R_p \| (R_s + 1/G_{ds,p}) = R_p * (R_s + 1/G_{ds,p})/(R_p + R_s + 1/G_{ds,p}).$$

Similarly, when the output Out is at the voltage $V_{ol}$, the expression reduces to:

$$Z_{out} = R_p \| (R_s + 1/G_{ds,n}) = R_p * (R_s + 1/G_{ds,n})/(R_p + R_s + 1/G_{ds,n}).$$

Therefore, the output impedance $Z_{out}$ of the clock driver circuit 15 when the output is not transitioning resembles that of the previously described clock driver circuit 25 shown in FIG. 13.

Figure 17:
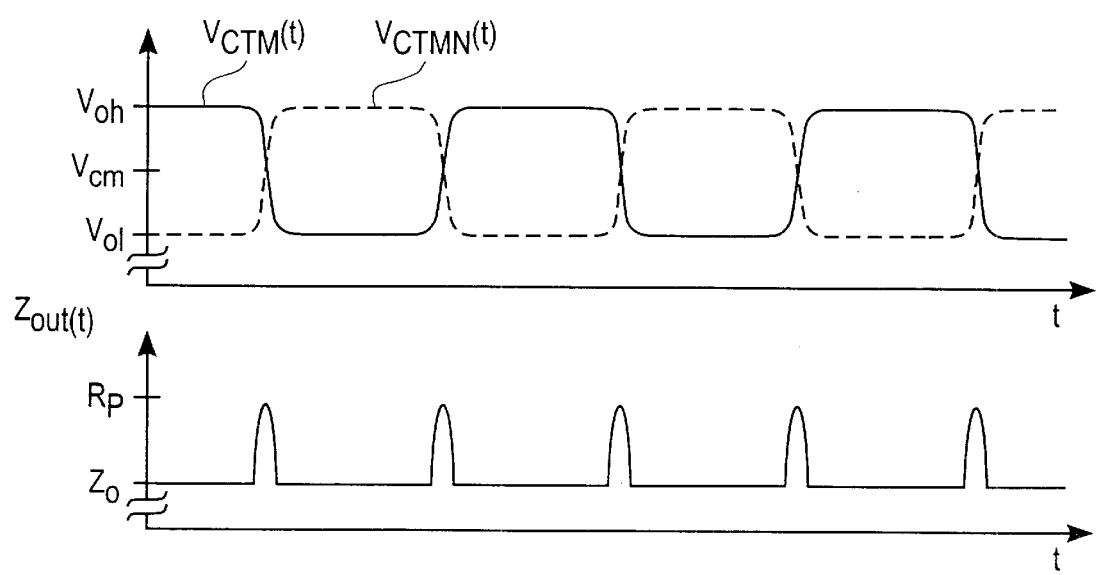
FIG. 17 is a diagram illustrating the output voltage waveforms and output impedance of the clock driver of FIG. 16 as a function of time.

Unlike the clock driver 25, however, the output impedance $Z_{out}$ of the clock driver circuit 15 does not increase significantly when its outputs are transitioning. As indicated earlier with respect to the clock driver 25, the $1/G_{ds,p}$ and $1/G_{ds,n}$ values of the transistors $M_{p1}$, $M_{p2}$, $M_{n1}$ and $M_{n2}$ increase dramatically when the outputs Out and Out__ are transitioning between $V_{oh}$ and $V_{ol}$. However, since the mid node is a differential ground, the differential clock lines 17 still see a relatively low resistance path to ground through the parallel resistors $R_{p1}$ and $R_{p2}$. Therefore, the maximum output impedance $Z_{out}$ of each output of the clock driver circuit 15 is limited to $R_p$, the resistance of the parallel resistors $R_{p1}$ and $R_{p2}$. The variation in the output impedance $Z_{out}$ of the clock driver circuit 15 in relation to the output signals CTM and CTMN is illustrated in FIG. 17.

In general, while the output driver circuit of the present invention operates within the predefined range of expected operating conditions, the output impedance $Z_{out}$ of the output driver circuit will not fall below about 75 percent and will not exceed about 150 percent of the clock line impedance $Z_0$. Preferably (i.e., in the preferred embodiments), the output driver's passive network limits variation in the output driver's output impedance to an even smaller range, such as between 90 and 140 percent of $Z_0$.

Besides having a well-controlled output impedance, the clock driver circuit 15 provides a readily adjustable voltage swing $V_{sw}$ and common-mode voltage $V_{cm}$. The voltage swing $V_{sw}$ of the signals CTM and CTMN generated between the outputs Out and Out__ is:

$$V_{sw} = (V_{DD} - V_{ds,p} - V_{ds,n} - V_{SS}) * [(R_{p1} + R_{p2}) \| (2*Z_0)]/\{R_{s1} + R_{s2} + [(R_{p1} + R_{p2}) \| (2*Z_0)]\},$$

where $V_{ds,p}$ is the drain-to-source voltage of the p-channel transistors $M_{p1}$ and $M_{p2}$ when the gate is at $V_{SS}$ and $V_{ds,n}$ is the drain-to-source voltage of the n-channel transistors $M_{n1}$ and $M_{n2}$ when the gate is at $V_{DD}$. This equation for the output voltage swing $V_{sw}$ is derived by applying simple voltage divider analysis to the circuit shown in FIG. 16.

Using similar voltage divider analysis, the common-mode voltage $V_{cm}$ of the signals CTM and CTMN is:

$$V_{cm}=V_{SS}+V_{ds,n}+0.5*V_{sw}+(V_{DD}-V_{ds,p}-V_{ds,n}-V_{SS})*R_{s1}/\{R_{s1}+R_{s2}+[(R_{p1}+R_{p2})\|(2*Z_0)]\}.$$

Examining these equations, it can be seen that the voltage swing $V_{sw}$ and the common-mode voltage $V_{cm}$ may be set to the desired level by adjusting the resistances of the series resistors $R_{s1}$ and $R_{s2}$, the resistances of the parallel resistors $R_{p1}$ and $R_{p2}$ or the sizes (i.e., channel length and width) of the transistors $M_{p1}$, $M_{p2}$, $M_{n1}$ and $M_{n2}$ accordingly.

In the preferred embodiment of the clock driver circuit 15, the circuit is symmetrical such that the series resistors $R_{s1}$ and $R_{s2}$ are equal and the parallel resistors $R_{p1}$ and $R_{p2}$ are equal. If the clock driver circuit 15 is symmetrical, the equations for the voltage swing $V_{sw}$ and the common-mode voltage $V_{cm}$ reduce to the following:

$$V_{sw}=(V_{DD}-V_{ds,p}-V_{ds,n}-V_{SS})*(R_p\|Z_0)/[R_s+(R_p\|Z_0)]$$

and $$V_{cm}=V_{SS}+V_{ds,n}+0.5*V_{sw}+(V_{DD}-V_{ds,p}-V_{ds,n}-V_{SS})*R_s/[R_s+(R_p\|Z_0)],$$

where $R_s=R_{s1}=R_{s2}$ and $R_p=R_{p1}=R_{p2}$.

In the preferred embodiment of the clock driver circuit 15, the transistors $M_{p1}$, $M_{p2}$, $M_{n1}$ and $M_{n2}$ are sized large enough to operate well into the linear region. As a result, the voltage $V_{ds,p}+V_{ds,n}$ will be much less than the voltage $V_{DD}-V_{SS}$ and the equations for the output voltage swing $V_{sw}$ and the common-mode voltage $V_{cm}$ then reduce to the following approximations:

$$V_{sw}\cong(V_{DD}-V_{SS})*(R_p\|Z_0)/[R_s+(R_p\|Z_0)]$$

and $$V_{cm}\cong V_{SS}+0.5*V_{sw}+(V_{DD}-V_{SS})*R_s/[R_s+(R_p\|Z_0)]\cong 0.5*(V_{DD}-V_{SS}).$$

Figure 18:
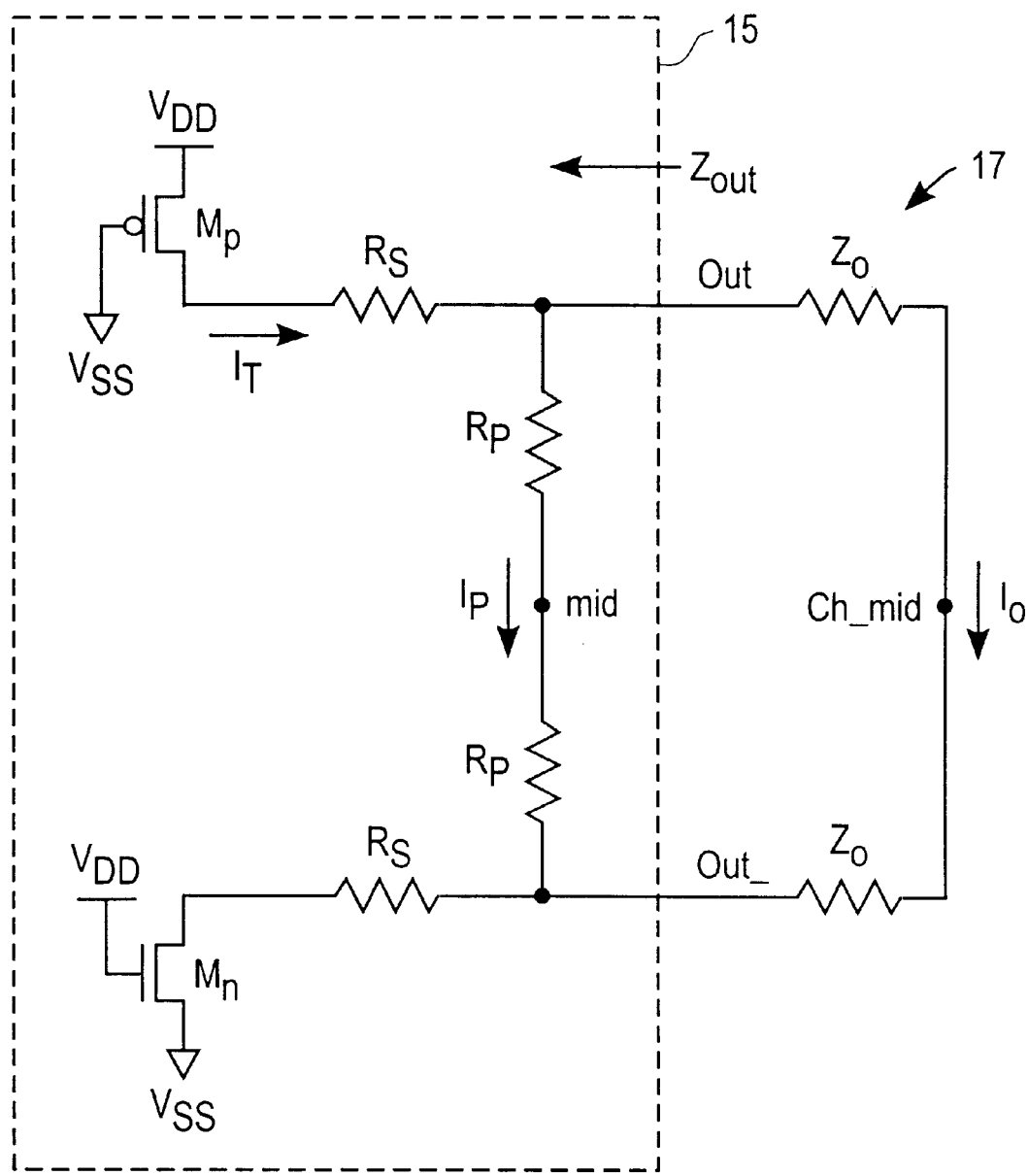
FIG. 18 is a circuit diagram of a DC equivalent circuit for the clock driver and differential clock lines of FIG. 16 when $V_{In}=0$ V and $V_{In\_}=V_{DD}$.

A procedure for designing the clock driver circuit 15 to provide a specified output impedance $Z_{out}$, voltage swing $V_{sw}$ and common-mode voltage $V_{cm}$ will now be described. FIG. 18 shows a DC equivalent circuit diagram of the clock driver circuit 15 that is useful for illustrating the design procedure. The design procedure assumes that the clock driver circuit 15 is symmetrical such that $R_s=R_{s1}=R_{s2}$, $R_p=R_{p1}=R_{p2}$, $M_p=M_{p1}=M_{p2}$ and $M_n=M_{n1}=M_{n2}$. In the figure, the input In is driven to $V_{SS}$ and the input In_ is driven to $V_{DD}$ to turn on transistors $M_{p1}$ and $M_{n2}$ and turn off transistors $M_{n1}$ and $M_{p2}$. To simplify the diagram, the two transistors which are turned off have been omitted.

Referring to FIG. 18, the design procedure is as follows. The procedure assumes the following parameters are given: $V_{DD}$, $V_{SS}$, $V_{sw}$, $V_{cm}$, $Z_0$ and f, where f is the frequency of the output signals CTM and CTMN.

Step 1: Choose $R_p$ such that $R_p>Z_0$. This sets the maximum output impedance $Z_{out}$ of the output driver circuit 15.

Step 2: Compute $I_o=V_{sw}/(2*Z_0)$. $I_o$ is the current flowing through the differential clock lines 17.

Step 3: Compute $I_p=V_{sw}/(2*R_p)$.

Step 4: Compute $I_T=I_o+I_p$.

Step 5: Compute $R_T=(Z_0*R_p)/(R_p-Z_0)$. $R_T=R_s+1/G_{ds}$ and $1/G_{ds}$ is the desired drain-to-source resistance of the transistors $M_p$ or $M_n$ when turned on.

Step 6: Choose $R_s$ such that $R_s<R_T$. Calculate $1/G_{ds}=R_T-R_s$.

Step 7: Compute $|V_{ds,p}|=V_{DD}-[(I_T*R_s)+(0.5*V_{sw})+V_{cm}]$. $V_{ds,p}$ is the drain-to-source voltage of the transistors $M_{p1}$ or $M_{p2}$.

Step 8: Compute $V_{ds,n}=V_{cm}-[(0.5*V_{sw})+(I_T*R_s)]$. $V_{ds,n}$ is the drain-to-source voltage of the transistors $M_{n1}$ and $M_{n2}$.

Step 9: Adjust the channel width ($W_p$ or $W_n$) and length ($L_p$ or $L_n$) of the transistors $M_{p1}$, $M_{p2}$, $M_{n1}$ and $M_{n2}$ such that:

$$I_{ds,p}=I_{ds,n}=I_T, \text{ where:} \quad (a)$$

$$I_{ds,p}=K_p*W_p/L_p*\{[|V_{gs,p}-V_{T,p}|*V_{ds,p}]-V_{ds,p}^2/2\},$$

$$I_{ds,n}=K_n*W_n/L_n*\{[(V_{gs,n}-V_{T,n})*V_{ds,n}]-V_{ds,n}^2/2\}, \text{ and}$$

$$1/G_{ds,p}=1/G_{ds,n}=1/G_{ds}, \text{ where:} \quad (b)$$

$$G_{ds,p}=d(I_{ds,p})/d(V_{ds,p}),$$

$$G_{ds,n}=d(I_{ds,n})/d(V_{ds,n}).$$

$I_{ds,p}$ and $I_{ds,n}$ are the drain-to-source currents, $G_{ds,p}$ and $G_{ds,n}$ are the drain-to-source conductances, $K_p$ and $K_n$ are the process gain factors, and $V_{T,p}$ and $V_{T,n}$ are the threshold voltages of the transistors $M_{p1}/M_{p2}$ and $M_{n1}/M_{n2}$, respectively. Typically, $|V_{gs,p}|=V_{gs,n}=V_{DD}-V_{SS}$.

Step 10: If it is impossible to satisfy both equations 9(a) and 9(b), return to step 6 and choose a different value for $R_s$. Repeat steps 6 to 9 until the equation in step 9(a) is met nearly exactly and the equation in step 9(b) is met approximately.

Step 11 (optional): If the clock driver circuit 15 includes the capacitor $C_{mid}$, adjust the value of the capacitance of the capacitor $C_{mid}$ such that its reactance $X_{Cmid}$ is less than about 10 percent of $R_p$, i.e.: $C_{mid}>5/(\pi*f*R_p)$.

The following example illustrates the design procedure for an actual implementation of the clock driver circuit 15. In this example, the clock driver circuit 15 is implemented in a standard 0.5 micron ($\mu$m), 3.3 volt (V) CMOS process. The following parameters are given for the design: $V_{DD}$=3.465 V, $V_{SS}$=0.0 V, $V_{sw}$=600 mV, $V_{cm}$=1.70 V, $Z_0$=28 ohms and f=400 MHz. The steps in the design procedure are as follows:

Step 1: Let $R_p$=39 ohms (this is a common 5% tolerance resistor value).

Step 2: $I_o$=10.71 mA.

Step 3: $I_p$=7.69 mA.

Step 4: $I_T$=18.41 mA.

Step 5: $R_T$=99 ohms.

Step 6: Let $R_s$=68 ohms (this is a common 5% tolerance resistor value). Thus, $1/G_{ds}$=31 ohms.

Step 7: $V_{ds,p}$=213 mV.

Step 8: $V_{ds,n}$=148 mV.

Step 9: For $I_{ds,p}=I_{ds,n}$ to equal $I_T$=18.41 mA, computer simulations indicate that the required dimensions for the transistors $M_p$ and $M_n$ are: $W_p$=275 $\mu$m, $L_p$=0.5 $\mu$m, $W_n$=235 $\mu$m and $L_p$=1.0 $\mu$m. With these dimensions, the resistance of the transistors $M_p$ and $M_n$ is $1/G_{ds,p}$=15 ohms and $1/G_{ds,n}$=12 ohms, which is sufficiently close to the desired value of $1/G_{ds}$=31 ohms.

Step 10: Equations 9(a) and 9(b) are both satisfied.

Step 11: $C_{mid}$>102 pF. Let $C_{mid}$=100 pF (this is a standard capacitance value).

In this design example, the output impedance $Z_{out}$ of the clock driver circuit 15 when the outputs Out and Out_ are at either $V_{oh}$ or $V_{ol}$ is $Z_{out}=R_p*(R_s+1/G_{ds})/(R_p+R_s+1/G_{ds})$= 26.2 ohms (i.e., about 93.5% of $Z_0$). This value is very close to the desired impedance of $Z_0$=28 ohms. The maximum output impedance $Z_{out}$, which occurs when the outputs are transitioning, is $Z_{out}=R_p$=39 ohms, a value that is about 139 percent of the value of the loaded impedance $Z_0$. Therefore, it can be seen that the variation in the output impedance $Z_{out}$ of the clock driver circuit 15 is relatively well-controlled, thereby minimizing the occurrence of secondary reflections at the outputs Out and Out_.

Figure 19:
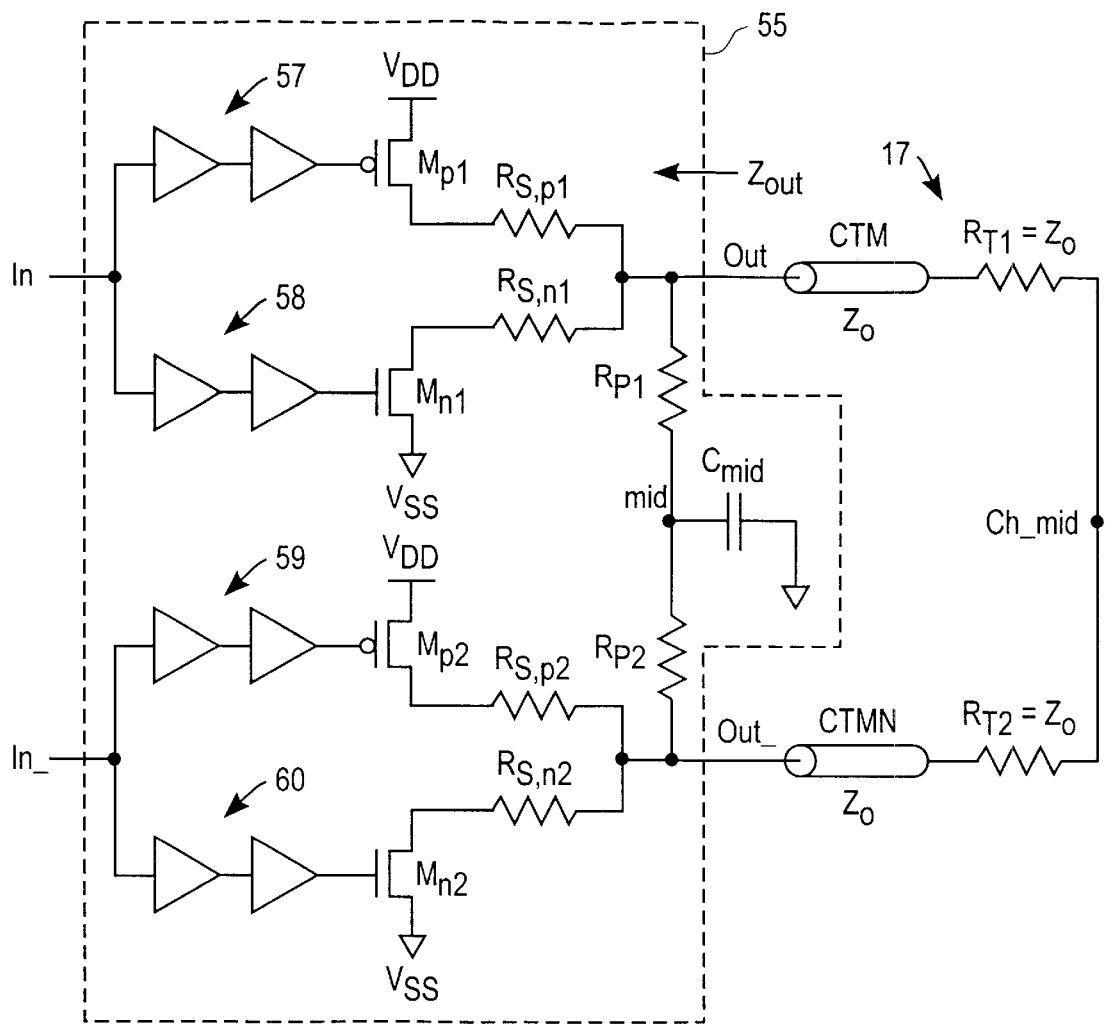
FIG. 19 is a circuit diagram of a quasi-differential clock driver in accordance with an alternate embodiment of the present invention.

FIG. 19 is a circuit diagram of a quasi-differential clock driver 55 in accordance with an alternate embodiment of the present invention. Quasi-differential clock driver 55 is identical to the clock driver circuit 15 just described except for two modifications that further enhance its performance. The modifications can be made either simultaneously as illustrated in the figure or individually.

The first modification is that the clock driver circuit 55 includes predriver circuits 57, 58, 59 and 60. The predriver circuits 57 and 58 are connected between the input In and the gates of the transistors $M_{p1}$ and $M_{n1}$, respectively. Similarly, the predriver circuits 59 and 60 are connected between the input In_ and the gates of the transistors $M_{p2}$ and $M_{n2}$, respectively.

The predriver circuits 57, 58, 59 and 60 minimize the wasted "shoot-through" current passing through the transistors $M_{p1}/M_{n1}$ and $M_{p2}/M_{n2}$ from $V_{DD}$ to $V_{SS}$ during transitions of the output signals CTM and CTMN, respectively. The predriver circuits prevent the shoot-through from occurring by skewing the timing of the signals fed to the p-channel transistors $M_{p1}$ and $M_{p2}$ as compared with the signals fed to the n-channel transistors $M_{n1}$ and $M_{n2}$ so that the transistor in each driver circuit that had been supplying current is shut off before the other transistor is turned on. For example, if transistor $M_{p1}$ is on and transistor $M_{n1}$ is off (i.e., $V_{g,p1}=V_{g,n1}=V_{SS}$), the predriver circuits 57 and 58 skew the timing of the input signals to transistors $M_{p1}$ and $M_{n1}$ so that the input to $M_{p1}$ rises before the input to $M_{n1}$ rises, thereby turning off transistor $M_{p1}$ before turning on transistor $M_{n1}$.

The predriver circuits 57, 58, 59 and 60 each have a delay from its input to its output for a low-to-high and high-to-low output transition. To provide the desired timing, the predriver circuits have the following input to output delays: (1) the low-to-high delay of the predriver circuit 58 is larger than the low-to-high delay of the predriver circuit 57, (2) the high-to-low delay of the predriver circuit 57 is larger than the high-to-low delay of the predriver circuit 58, (3) the low-to-high delay of the predriver circuit 60 is larger than the low-to-high delay of the predriver circuit 59 and (4) the high-to-low delay of the predriver circuit 59 is larger than the high-to-low delay of the predriver circuit 60. The technique of using predrivers to reduce the shoot-through current in output drivers is well-known in the art and thus the details of the predrivers 57, 58, 59 and 60 will not be further discussed.

The second modification to the clock driver circuit 55 is that the series resistors $R_{s1}$ and $R_{s2}$ of the clock driver circuit 15 are each replaced by two resistors. $R_{s1}$ is replaced by series resistors $R_{s,p1}$ and $R_{s,n1}$, where $R_{s,p1}$ is connected between the drain of the transistor $M_{p1}$ and the output Out and $R_{s,n1}$ is connected between the output Out and the drain of the transistor $M_{n1}$. $R_{s2}$ is replaced by series resistors $R_{s,p2}$ and $R_{s,n2}$, where $R_{s,p2}$ is connected between the drain of the transistor $M_{p2}$ and the output Out_ and $R_{s,n2}$ is connected between the output Out_ and the drain of the transistor $M_{n2}$. This arrangement of the series resistors allows a different $R_s$ value to be selected for the p-channel transistors $M_{p1}$ and $M_{p2}$ and for the n-channel transistors $M_{n1}$ and $M_{n2}$ (see step 6 of the design procedure above). This is particularly useful to accommodate large differences between the conductances $G_{ds,p}$ and $G_{ds,n}$ of the p-channel and n-channel transistors, respectively, so that the output impedance of each CMOS inverter is approximately the same regardless of whether its p- or n-channel transistor is on. The resistor arrangement also reduces the shoot-through current in the clock driver circuit because of the increased resistance between the p- and n-channel transistors of the clock driver's CMOS inverters.

Figure 20:
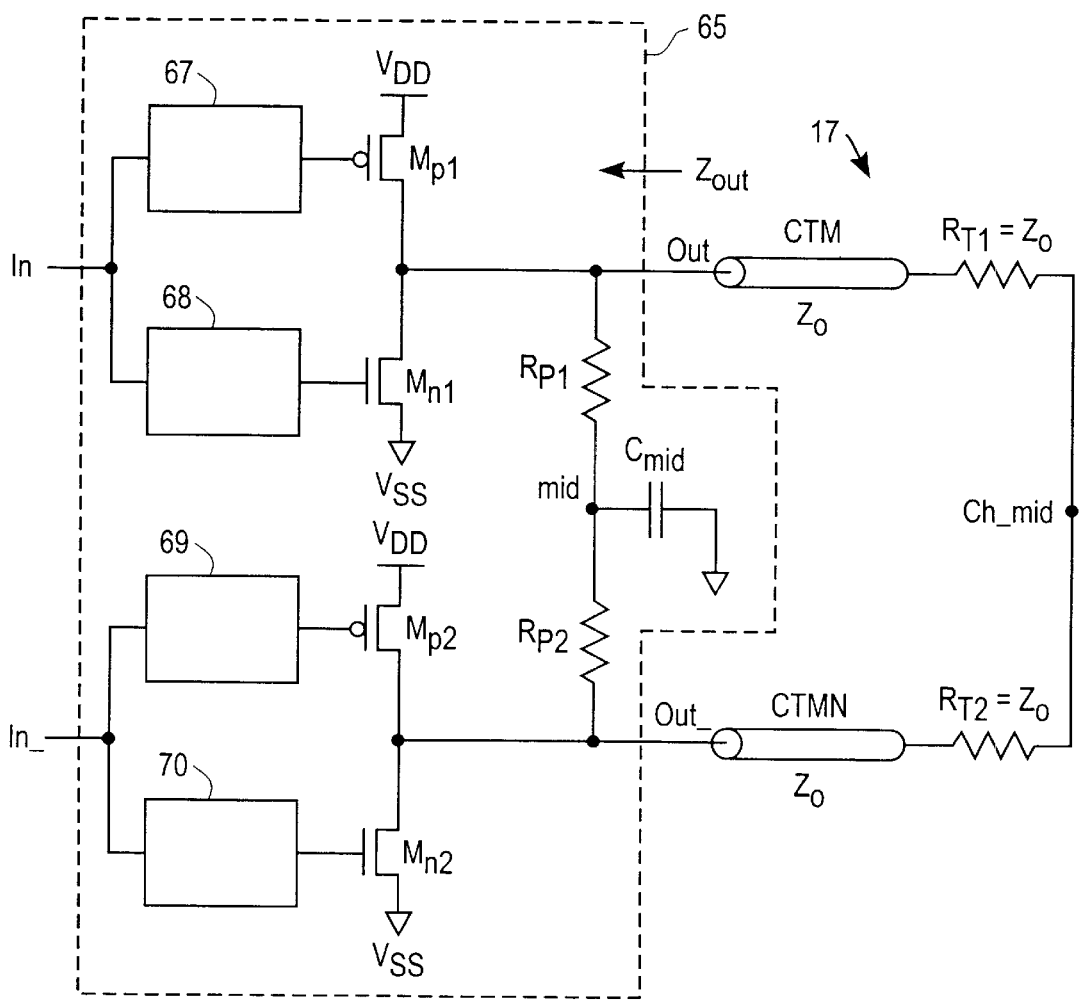
FIG. 20 is a circuit diagram of a quasi-differential clock driver in accordance with a second alternate embodiment of the present invention.

FIG. 20 is a circuit diagram of a quasi-differential clock driver circuit 65 in accordance with a second alternate embodiment of the present invention. Quasi-differential clock driver circuit 65 is similar in construction to the clock driver circuit 15 described above except that the circuit includes predrivers 67, 68, 69 and 70 to further improve its performance. The clock driver circuit 65 also omits the series resistors $R_{s1}$ and $R_{s2}$. The predrivers 67 and 68 are connected between the input In and the gates of the transistors $M_{p1}$ and $M_{n1}$, respectively. Similarly, the predrivers 69 and 70 are connected between the input In_ and the gates of the transistors $M_{p2}$ and $M_{n2}$, respectively.

The predrivers 67, 68, 69 and 70 are used to drive the transistors $M_{p1}$, $M_{n1}$, $M_{p2}$ and $M_{n2}$, respectively, such that the transistors operate in either the saturation or cutoff regions of operation only. Unlike the transistors of the clock driver circuit 15, the transistors $M_{p1}$, $M_{n1}$, $M_{p2}$ and $M_{n2}$ never operate in the linear region. Consequently, the resistance $1/G_{ds}$ of the transistors $M_{p1}$, $M_{n1}$, $M_{p2}$ and $M_{n2}$ is always very large. Because of this, the output impedance $Z_{out}$ is not significantly affected by variations in the transistor conductance $G_{ds}$ and is essentially equal to the resistance of the parallel resistors $R_{p1}$ and $R_{p2}$, that is:

$$Z_{out}=R_p \| 1/G_{ds}=(R_p*1/G_{ds})/(R_p+1/G_{ds}) \cong R_p,$$

where $R_p=R_{p1}=R_{p2}$. Therefore, the output impedance $Z_{out}$ of the clock driver circuit 65 is essentially constant, providing a very close match to the loaded impedance $Z_0$ of the differential clock lines 17 under all operating conditions.

A procedure for designing the clock driver circuit 65 to provide a specified output impedance $Z_{out}$, voltage swing $V_{sw}$ and common-mode voltage $V_{cm}$ will now be described. The design procedure assumes that the clock driver circuit 65 is symmetrical such that $R_p=R_{p1}=R_{p2}$, $M_p=M_{p1}=M_{p2}$ and $M_n=M_{n1}=M_{n2}$. The procedure assumes the following parameters are given: $V_{DD}$, $V_{SS}$, $V_{sw}$, $V_{cm}$, $Z_0$ and f.

Step 1: Choose $R_p$ such that $R_p=Z_0$. This sets the output impedance $Z_{out}$ of the output driver circuit 65 to equal $Z_0$.

Step 2: Compute $I_o=V_{sw}/(2*Z_0)$. $I_o$ is the current flowing through the differential clock lines 17.

Step 3: Compute $I_p=V_{sw}/(2*R_p)$.

Step 4: Compute $I_T=I_o+I_p$.

Step 5: Compute $|V_{ds,p}|=V_{DD}-V_{cm}+(0.5*V_{sw})$. $V_{ds,p}$ is the drain-to-source voltage of the transistors $M_{p1}$ and $M_{p2}$.

Step 6: Compute $V_{ds,n}=V_{cm}-V_{SS}-(0.5*V_{sw})$. $V_{ds,n}$ is the drain-to-source voltage of the transistors $M_{n1}$ and $M_{n2}$.

Step 7: Adjust the channel width $W_p$ and length $L_p$ and the gate voltage $V_{gs,p}$ of the transistors $M_{p1}$ and $M_{p2}$ such that:

$I_{ds,p} = I_T$, where: (a)

$I_{ds,p} = 0.5*K_p*W_p/L_p*(V_{gs,p}-V_{T,p})^2$, and $|V_{gs,p}|-|V_{ds,p}|<|V_{T,p}|$. (b)

$I_{ds,p}$ is the drain-to-source current, $K_p$ is the process gain factor, and $V_{T,p}$ is the threshold voltage of the transistors $M_{p1}$ and $M_{p2}$.

Step 8: Adjust the channel width $W_n$ and length $L_n$ and the gate voltage $V_{gs,n}$ of the transistors $M_{n1}$ and $M_{n2}$ such that:

$I_{ds,n} = I_T$, where: (a)

$I_{ds,n} = 0.5*K_n*W_n/L_n*(V_{gs,n}-V_{T,n})^2$, and $V_{gs,n}-V_{ds,n}<V_{T,n}$. (b)

$I_{ds,n}$ is the drain-to-source current, $K_n$ is the process gain factor, and $V_{T,n}$ is the threshold voltage of the transistors $M_{n1}$ and $M_{n2}$.

Step 9: Design the predrivers 67 and 69 to drive the gates of the p-channel transistors $M_{p1}$ and $M_{p2}$ with the voltage $V_{gs,p}$ determined in step 7. Design the predrivers 68 and 70 to drive the gates of the n-channel transistors $M_{n1}$ and $M_{n2}$ with the voltage $V_{gs,n}$ determined in step 8. Driving the transistors with these voltages ensures that the transistors operate in the saturation or cutoff regions only. The design of the predrivers 67, 68, 69 and 70 is beyond the scope of the present invention and thus will not be discussed further.

Step 10 (optional): If the clock driver circuit 65 includes the capacitor $C_{mid}$, adjust the value of the capacitance of the capacitor $C_{mid}$ such that its reactance $X_{Cmid}$ is less than about 10 percent of $R_p$, i.e.: $C_{mid} > 5/(\pi*f*R_p)$.

Step 11 (optional): Set $R_p$ slightly higher than $Z_0$ such that: $R_p \| G_{ds,p} = Z_0$ or $R_p \| G_{ds,n} = Z_0$.

In summary, the preferred embodiment of the present invention includes a differential clock driver circuit providing several advantages over prior art clock driver designs. First, the clock driver circuit does not rely on the noise-prone voltages $V_{Term}$ or $V_{Ref}$ to generate the clock signal. Second, the clock driver circuit has a well-controlled output impedance $Z_{out}$ that closely matches the loaded impedance $Z_0$ of the differential clock lines at all times, thereby minimizing the occurrence of secondary reflections at its output. These two features reduce the jitter of the clock signal produced by the clock driver circuit. Third, the voltage swing $V_{sw}$ and common-mode voltage $V_{cm}$ of the clock driver circuit can be readily adjusted by varying the values of the resistors and/or the sizes of the transistors in the circuit.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims. For example, the output driver circuit of the present invention may be used to drive signals other than a clock signal onto a bus, such as data or address signals.

What is claimed is:

1. An electronic system for generating and transmitting a digital signal, comprising:
   (1) an output driver circuit, comprising:
      (a) a driver circuit having an output;
      (b) a passive network coupled to the output of the driver circuit, comprising:
         (i) a series resistor including a first end coupled to the output of the driver circuit and a second end;
         (ii) a parallel resistor including a first end coupled to the second end of the series resistor and a second end;
         (iii) a capacitor coupled between the second end of the parallel resistor and a first voltage supply; and
         (iv) an output coupled to the second end of the series resistor and to the first end of the parallel resistor for coupling to the conductor; and
      (c) an output coupled to the output of the passive network, the output having an output impedance; and
   (2) a signal line, comprising:
      (a) a conductor including a first end coupled to the output of the output driver circuit and a second end;
      (b) a resistor including a first end coupled to the second end of the conductor and a second end; and
      (c) a capacitor coupled between the second end of the resistor and a second voltage supply.

2. An output driver circuit including first and second outputs for coupling to first and second conductors, respectively, of a differential signal line, the first and second outputs having first and second output impedances, respectively, the output driver circuit comprising:

a first driver circuit having an output;

a second driver circuit having an output; and a passive network coupled to the outputs of the first and second driver circuits and to the first and second outputs of the output driver circuit, the passive network configured to limit variation in the first and second output impedances to a predefined range while the output driver circuit operates within a predetermined range of expected operating conditions;

wherein the first and second conductors have first and second loaded impedances, respectively, and the first and second output impedances fall between about 75 percent and 150 percent of the first and second loaded impedances, respectively, while the output driver circuit operates within the predefined range of expected operating conditions.

3. An output driver circuit for coupling to a differential signal line having a first conductor and a second conductor, comprising:

a first driver circuit having an input and an output;

a second driver circuit having an input and an output; and a passive network coupled to the outputs of the first and second driver circuits and including a first output for coupling to the first conductor and a second output for coupling to the second conductor, comprising:

a first parallel resistor including a first end coupled to the first output of the passive network and a second end coupled to a mid node; and a second parallel resistor including a first end coupled to the second output of the passive network and a second end coupled to the mid node, wherein the mid node acts as a differential ground when a differential signal is supplied to the inputs of the first and second driver circuits.

4. The output driver circuit of claim 3, wherein the passive network further comprises:

a capacitor including a first end coupled to the differential ground node and a second end coupled to a voltage supply.

5. The output driver circuit of claim 3, wherein:

the first and second driver circuits each comprise a p-channel transistor and an n-channel transistor connected in a CMOS inverter configuration; and the passive network further comprises:

a first series resistor including a first end connected to the output of the first driver circuit and a second end connected to the first end of the first parallel resistor; and a second series resistor including a first end connected to the output of the second driver circuit and a second end connected to the first end of the second parallel resistor.

6. The output driver circuit of claim 5, further comprising:

a first predriver including an input connected to the input of the first driver circuit and an output connected to the gate of the p-channel transistor of the first driver circuit, the first predriver having a first and second delay from its input to its output for a low-to-high and high-to-low output transition, respectively;

a second predriver including an input connected to the input of the first driver circuit and an output connected to the gate of the n-channel transistor of the first driver circuit, the second predriver having a third and fourth delay from its input to its output for a low-to-high and high-to-low output transition, respectively, wherein the third delay is larger than the first delay and the second delay is larger than the fourth delay;

a third predriver including an input connected to the input of the second driver circuit and an output connected to the gate of the p-channel transistor of the second driver circuit, the third predriver having a fifth and sixth delay from its input to its output for a low-to-high and high-to-low output transition, respectively; and a fourth predriver including an input connected to the input of the second driver circuit and an output connected to the gate of the n-channel transistor of the second driver circuit, the fourth predriver having a seventh and eighth delay from its input to its output for a low-to-high and high-to-low output transition, respectively, wherein the seventh delay is larger than the fifth delay and the sixth delay is larger than the eighth delay.

7. An electronic system for generating and transmitting a digital signal, comprising:

an output driver circuit, comprising:
(a) a first driver circuit having an input and an output;
(b) a second driver circuit having an input and an output;
(c) a passive network coupled to the outputs of the first and second driver circuits, comprising:
  (i) a first parallel resistor including a first end coupled to a first output of the passive network and a second end coupled to a first mid node; and
  (ii) a second parallel resistor including a first end coupled to a second output of the passive network and a second end coupled to the first mid node to form a first differential ground when a differential signal is supplied to the inputs of the first and second driver circuits; and
(d) first and second outputs coupled to the first and second outputs of the passive network, respectively; and a signal line, comprising:
(a) a first conductor including a first end coupled to the first output of the output driver circuit and a second end;
(b) a first resistor including a first end coupled to the second end of the first conductor and a second end coupled to a second mid node;
(c) a second conductor including a first end coupled to the second output of the output driver circuit and a second end; and
(d) a second resistor including a first end coupled to the second end of the second conductor and a second end coupled to the second mid node to form a second differential ground.

8. The electronic system of claim 7, further comprising a capacitor having a first end coupled to the second differential ground node and a second end coupled to a power supply.

9. The electronic system of claim 8, further comprising a second capacitor having a first end coupled to the first differential ground node and a second end coupled to a power supply.

10. The electronic system of claim 7, further comprising a capacitor having a first end coupled to the first differential ground node and a second end coupled to a power supply.

11. An output driver circuit for coupling to a differential signal line having a first conductor and a second conductor, comprising:

a first output for coupling to a first end of the first conductor;

a first p-channel transistor including a source coupled to a power supply, a drain coupled to the first output and a gate for receiving a first drive signal having a voltage such that the first p-channel transistor operates in a saturation or cutoff region of operation only;

a first n-channel transistor including a drain coupled to the first output, a source coupled to a ground supply and a gate for receiving a second drive signal having a voltage such that the first n-channel transistor operates in a saturation or cutoff region of operation only;

a first parallel resistor including a first end coupled by a first series resistor to the first output and a second end coupled to a mid node;

a second output for coupling to a first end of the second conductor;

a second p-channel transistor including a source coupled to the power supply, a drain coupled to the second output and a gate for receiving a third drive signal having a voltage such that the second p-channel transistor operates in a saturation or cutoff region of operation only;

second n-channel transistor including a drain coupled to the second output, a source coupled to the ground supply and a gate for receiving a fourth drive signal having a voltage such that the second n-channel transistor operates in a saturation or cutoff region of operation only; and a second parallel resistor including a first end coupled by a second series resistor to the second output and a second end coupled to the mid node, the mid node providing a differential ground when the first, second, third and fourth drive signals are differential signals.

12. The output driver circuit of claim 11, further comprising:

a first predriver for receiving a first input signal and generating the first drive signal;

a second predriver for receiving the first input signal and generating the second drive signal;

a third predriver for receiving a second input signal and generating the third drive signal; and a fourth predriver for receiving the second input signal and generating the fourth drive signal.

13. The output driver circuit of claim 11, further comprising:

a capacitor including a first end coupled to the mid node and a second end coupled to a voltage supply.

* * * * *